(12) United States Patent
Wang et al.

(10) Patent No.: US 12,484,227 B2
(45) Date of Patent: Nov. 25, 2025

(54) MEMORY DEVICE WITH SOURCE LINE OVER A BONDING PAD

(71) Applicant: MACRONIX INTERNATIONAL CO., LTD., Hsinchu (TW)

(72) Inventors: Li-Wei Wang, New Taipei (TW); Hong-Ji Lee, Taoyuan (TW); Fu-Xing Zhou, New Taipei (TW); Shih-Chin Lee, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 840 days.

(21) Appl. No.: 17/745,903

(22) Filed: May 17, 2022

(65) Prior Publication Data

US 2023/0380174 A1 Nov. 23, 2023

(51) Int. Cl.
*H01L 27/11575* (2017.01)
*H01L 27/11582* (2017.01)
*H10B 43/27* (2023.01)
*H10B 43/50* (2023.01)

(52) U.S. Cl.
CPC .............. *H10B 43/50* (2023.02); *H10B 43/27* (2023.02)

(58) Field of Classification Search
CPC ..................................................... H10B 43/50
See application file for complete search history.

(56) References Cited

U.S. PATENT DOCUMENTS

| | | | |
|---|---|---|---|
| 2015/0037951 A1 | 2/2015 | Chang | |
| 2017/0200734 A1* | 7/2017 | Fujiki | .............. H01L 23/53204 |
| 2017/0271358 A1* | 9/2017 | Mori | ...................... H10B 41/30 |
| 2018/0032271 A1 | 2/2018 | Seo et al. | |
| 2019/0148399 A1* | 5/2019 | Jung | ...................... H10B 41/27 |
| | | | 257/324 |
| 2020/0357815 A1* | 11/2020 | Iwai | ...................... H10B 41/27 |
| 2020/0395373 A1* | 12/2020 | Huo | ................. H01L 21/31111 |
| 2021/0167083 A1* | 6/2021 | Kim | .................. H01L 23/53271 |
| 2022/0093639 A1 | 3/2022 | Song | |
| 2022/0157839 A1* | 5/2022 | Lee | ....................... H10B 41/40 |

FOREIGN PATENT DOCUMENTS

| | | | |
|---|---|---|---|
| TW | 201804473 A | 2/2018 | |
| WO | WO-2020252891 A1 * | 12/2020 | ............. H10B 43/35 |
| WO | WO-2023075856 A2 * | 5/2023 | ........ H01L 21/76843 |

* cited by examiner

*Primary Examiner* — Peter Bradford
(74) *Attorney, Agent, or Firm* — McClure, Qualey & Rodack, LLP

(57) ABSTRACT

An integrated circuit structure includes a substrate, a conductive layer, a plurality of memory devices, a bonding pad, and a source line. The conductive layer is over the substrate. The memory devices are stacked in a vertical direction over the conductive layer. The bonding pad is over the conductive layer. The source line extends upwardly from the bonding pad and has a lower portion inlaid in the bonding pad and an upper portion having a sidewall coterminous with a sidewall of the bonding pad. A top end of the source line has a first lateral dimension greater than a second lateral dimension of the bonding pad.

13 Claims, 20 Drawing Sheets

MEMORY DEVICE WITH SOURCE LINE OVER A BONDING PAD

BACKGROUND

Field of Invention

The present invention relates to a memory device. More particularly, the present invention relates to a method for forming a memory device.

Description of Related Art

The present disclosure generally relates to semiconductor devices, and particularly to methods of making a 3-dimensional (3D) memory device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

SUMMARY

The disclosure provides an integrated circuit (IC) structure includes a substrate, a conductive layer, a plurality of memory devices, a bonding pad, and a source line. The conductive layer is over the substrate. The memory devices are stacked in a vertical direction over the conductive layer. The bonding pad is over the conductive layer. The source line extends upwardly from the bonding pad and has a lower portion inlaid in the bonding pad and an upper portion having a sidewall coterminous with a sidewall of the bonding pad. A top end of the source line has a first lateral dimension greater than a second lateral dimension of the bonding pad.

In some embodiments, the first lateral dimension of the top end of the source line is greater than about 1.5 times a third lateral dimension of the source line measured in a position level with a top end of the bonding pad.

In some embodiments, the IC structure further includes a dielectric material laterally surrounding the source line and the bonding pad, wherein the first lateral dimension of the top end of the source line is greater than a third lateral dimension of the dielectric material on the bonding pad.

In some embodiments, the memory devices each comprise a gate layer laterally extending above the conductive layer, and the upper portion of the source line overlaps the gate layers of the memory devices.

In some embodiments, the IC structure further includes a plurality of insulating layers alternately stacked in the vertical direction with the gate layers, wherein the upper portion of the source line overlaps the insulating layers.

In some embodiments, the source line has a width increasing from a bottom end thereof to the top end thereof.

In some embodiments, the sidewall of the upper portion of the source line is curved from a bottom end thereof to the top end thereof.

In some embodiments, the sidewall of the upper portion of the source line is a stepped sidewall structure comprising an upper sidewall, a lower sidewall laterally set back from a bottom of the upper sidewall, and an intermediary surface connecting the bottom of the upper sidewall to a top of the lower sidewall.

In some embodiments, the source line is seam-free.

In some embodiments, the memory devices are NAND memory devices.

The disclosure provides a method for forming a memory device includes forming a multi-layered stack including insulating layers and sacrificial layers alternately stacked in a vertical direction over a substrate; forming a first through opening in the multi-layered stack; forming a memory layer, a channel layer, and a first dielectric material in the first through opening; forming a second through opening in the multi-layered stack; forming a memory array in the multi-layered stack; forming a second dielectric material over the memory array and in the second through opening; forming a source line in the second through opening.

In some embodiments, the method further incudes: forming a bonding pad in the second through opening, wherein the second dielectric material laterally surrounds the source line and the bonding pad, a first lateral dimension of a top end of the source line is greater than a second lateral dimension of the second dielectric material on the bonding pad.

In some embodiments, forming the second dielectric material further includes: performing a dry etching process on the second dielectric material to remove an overhang of the second dielectric material above the second through opening, wherein the dry etching process is performed by introducing a carbon fluoride ($C_xF_y$) over the second dielectric material, and x and y are integers and y/x is less than about 3.

In some embodiments, the carbon fluoride comprises $C_4Fr$, $C_4F_8$, $C_5F_8$, $C_3F_8$, or combinations thereof.

In some embodiments, the dry etching process is performed under a pressure in a range from about 10 to 100 mT.

In some embodiments, the dry etching process is performed in a time duration greater than about 15 seconds.

In some embodiments, the dry etching process is performed by turning on a RF bias generator with a RF bias power level in a range from about 3000 to 4000 W.

In some embodiments, a top end of the second through opening has a first lateral dimension greater than at least 1.5 times a second lateral dimension of a middle portion of the second through opening.

In some embodiments, the source line is made of tungsten.

In some embodiments, the method further incudes forming poly-silicon in the second through opening prior to performing the dry etching process.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
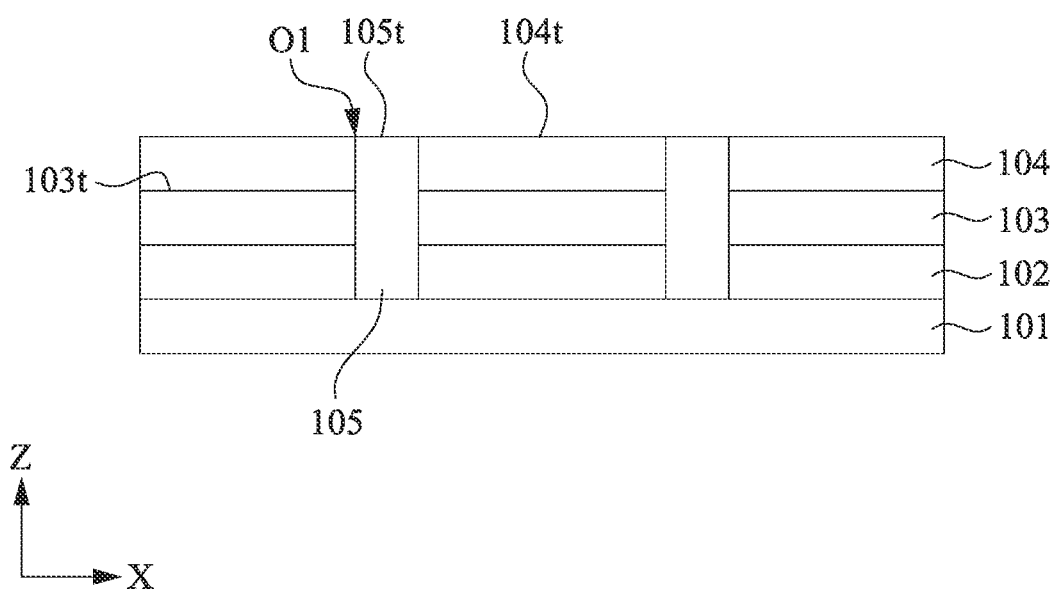
FIGS. 1-13, 14A, 15A, and 16 are cross-sectional views illustrating a method in various stages of forming an integrated circuit (IC) structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

For next generation semiconductor devices, it is desirable to include memories that can provide high density storage. Therefore, a 3-dimensional (3D) integrated circuit (IC) memory device, such as 3D NAND, can provide high density storage by its multi-layered structure. However, the more layers in 3D NAND are stacked, the harder it is for forming a source line in the 3D NAND, which may result in a seam formed in the source line. After a planarization process preformed on the source line, an etching gas (e.g., Fluorine) would be trapped/stuck in the seam and impact the following manufacturing process (e.g., fluorine leakage).

Therefore, the present disclosure in various embodiments provides a top widen etching process that can prevent a seam formed in the source line. Specifically, a top widen etching process is performed by introducing a high-polymeric etching gas on the dielectric material under a low pressure to modify the source line trench where the source line will be formed therein. The top widen etching process can increase vertically downward plasma strikes upon the dielectric material to enlarge the upper portion of the source line trench while only minimally removing the lower portion of the dielectric material in the source line trench. Therefore, a difference between the upper portion and the lower portion of the source line trench can be increased to improve a gap fill window of the following deposition process for forming the source line and prevent a seam formed in the source line.

FIGS. 1-13, 14A, 15A, and 16 are cross-sectional views illustrating a method in various stages of forming an integrated circuit (IC) structure 100 in accordance with some embodiments of the present disclosure. Referring to FIG. 1, in some embodiments, an isolation layer 102, a conductive layer 103, and an isolation layer 104 are formed in sequence on a semiconductor substrate 101. In some embodiments, the conductive layer 103 can serve as a common source line of the memory device. Subsequently, a plurality of contact openings O1 are formed to pass through the isolation layer 104, the conductive layer 103, and the isolation layer 102 to expose portions of the semiconductor substrate 101. Subsequently, a plurality of contact plugs 105 are respectively formed in the contact openings O1 to electrically contact the semiconductor substrate 101 with the conductive layer 103.

In some embodiments, the forming of the contact plugs 105 includes performing an etching process to remove portions of the isolation layer 104, the conductive layer 103, and the isolation layer 102, so as to form the contact openings O1. Subsequently, a conductive material, such as poly-silicon, is formed on the isolation layer 104 to fill the contact openings O1 by a deposition process, such as a low pressure chemical vapor deposition (LPCVD). Subsequently, a planarization process, such as a chemical mechanical polish (CMP) process, using the isolation layer 104 as a stop layer is performed to remove portions of the conductive material above the isolation layer 104, such that the contact plugs 105 are formed. Therefore, each of the contact plugs 105 has a top surface 105$t$ substantially higher than a top surface 103$t$ of the conductive layer 103 and substantially level with a top surface 104$t$ of the isolation layer 104.

In some embodiments, the semiconductor substrate 101 may be made of a p-type doped, n-type doped or undoped semiconductor material, such as poly-silicon, germanium (Ge) or any other suitable semiconductor material. In some embodiments, the isolation layers 102 and 104 may be made of dielectric material, such as silicon oxide, silicon nitride (SiN), silicon oxynitride (SiON), silicate or the arbitrary combinations thereof. In some embodiments, the contact plugs 105 may be made of TiN, TaN, Ti, Ta, Cu, Al, Ag, W, Ir, Ru, Pt, combinations thereof, or other suitable conductive materials.

Figure 2:
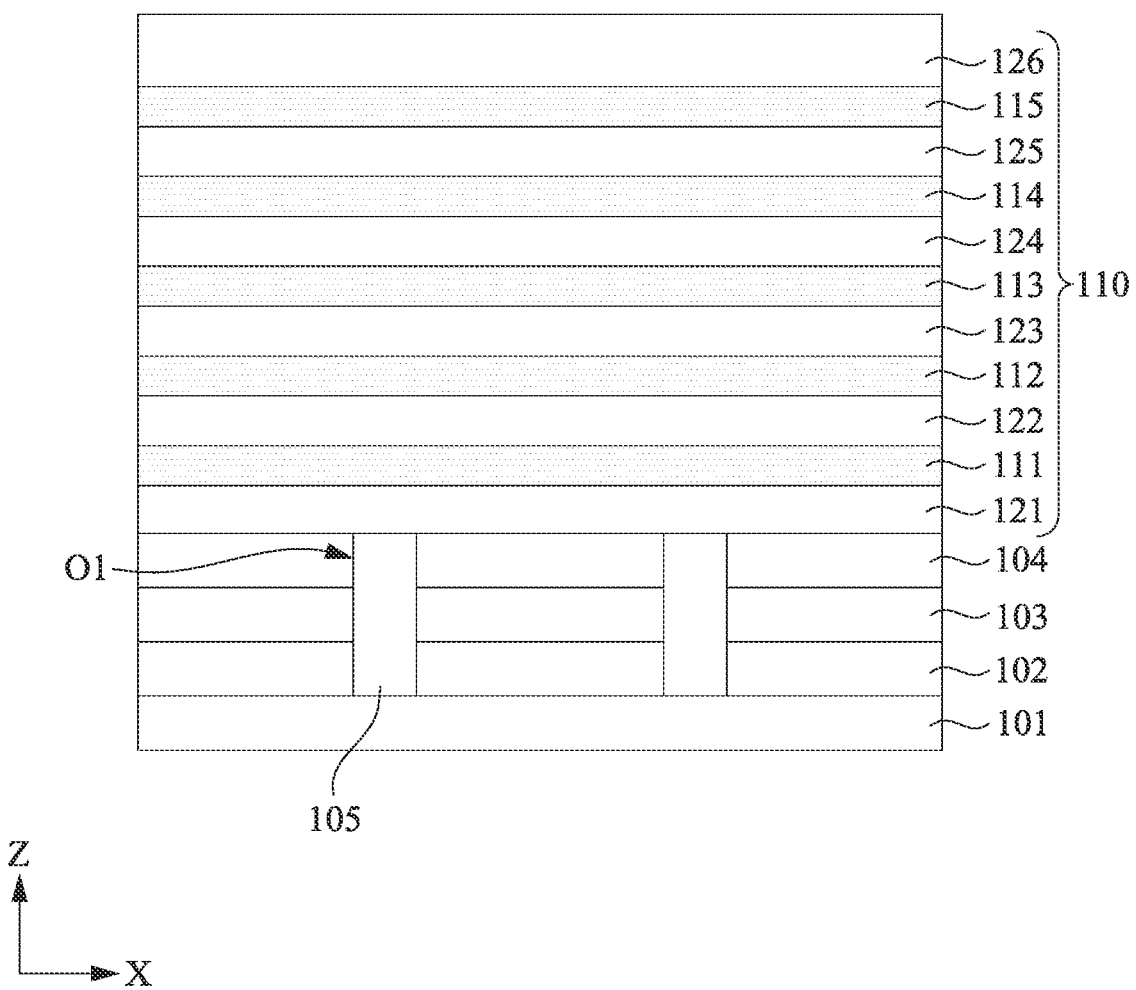

With reference to FIG. 2, a multi-layered stack 110 including alternating insulating layers 121-126 and sacrificial layers 111-115 is formed on the semiconductor substrate 101. The insulating layers 121-126 and the sacrificial layers 111-115 are parallel to each other and alternatively stacked on the semiconductor substrate 101 along Z-direction. The insulating layer 121 and the insulating layer 126 respectively serve as the bottommost layer and the topmost layer of the multi-layered stack 110. In some embodiments, the multi-layered stack 110 can be interchangeably referred to a film stack.

In some embodiments, the sacrificial layers 111-115 may be made of silicon-nitride compounds, such as SiN, SION, silicon carbonitride (SiCN), or the arbitrary combinations thereof. In some embodiments, the topmost sacrificial layer 115 can be interchangeably referred to a source line dummy SiN layer, and the sacrificial layers 111-114 can be interchangeably referred to word line dummy SiN layer. In some embodiments, the insulating layers 121-126 may be made of dielectric material, such as silicon oxide, SiN, SiON, silicate or the arbitrary combinations thereof. In some embodiments, the topmost insulating layer 126 can be interchangeably referred to a hard mask oxide layer. However, it should be appreciated that, in the embodiments of the present disclosure, the sacrificing layers 111-115 and the insulating layers 121-126 are made of different material. For example, the sacrificial layers 111-115 may be made of silicon nitride, and the insulating layers 121-126 may be made of silicon oxide. In some embodiments, the sacrificial layers 111-115 and the insulating layers 121-126 can be formed by low pressure chemical vapor deposition (LPCVD).

Figure 3:
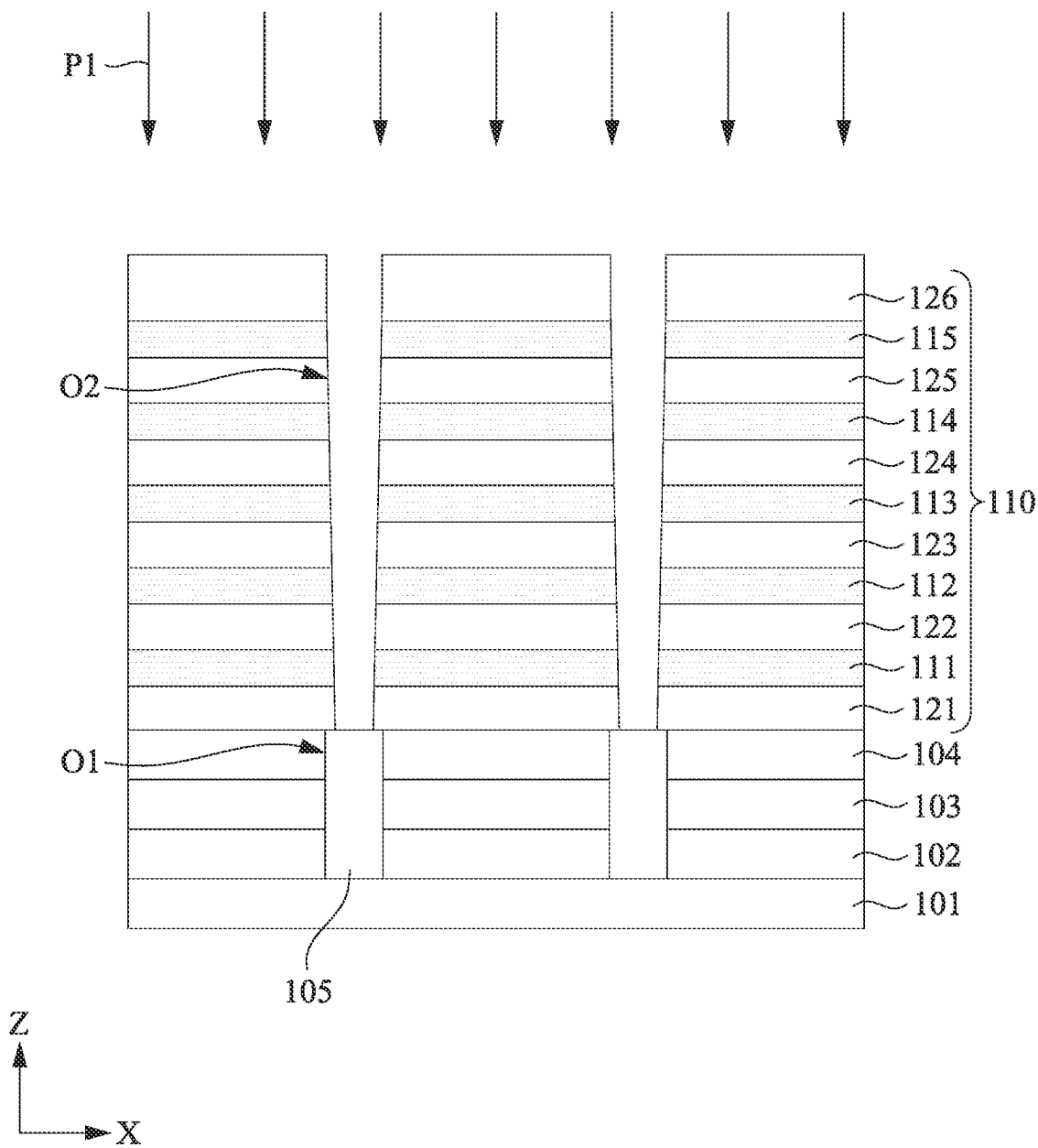

With reference to FIG. 3, an etching process P1, such as a hole etch process, is performed to form a plurality of through openings O2 passing through the multi-layered stack 110 to expose the contact plugs 105. In some embodiments, the etching process P1 can be an anisotropic etching process, such as a reactive ion etching (RIE) process, performed on the multi-layered stack 110 using a patterned hard mask layer (not shown) as an etching mask. The through openings O2 may be a plurality of circular through openings passing through the multi-layered stack 110 along Z-direction and terminate at the surface 105t of the contact plugs 105. The through openings O2 can be used to expose portions of the sacrificial layers 111-115 and the insulating layers 121-126 serving as sidewalls of the through openings O2.

Figure 4:
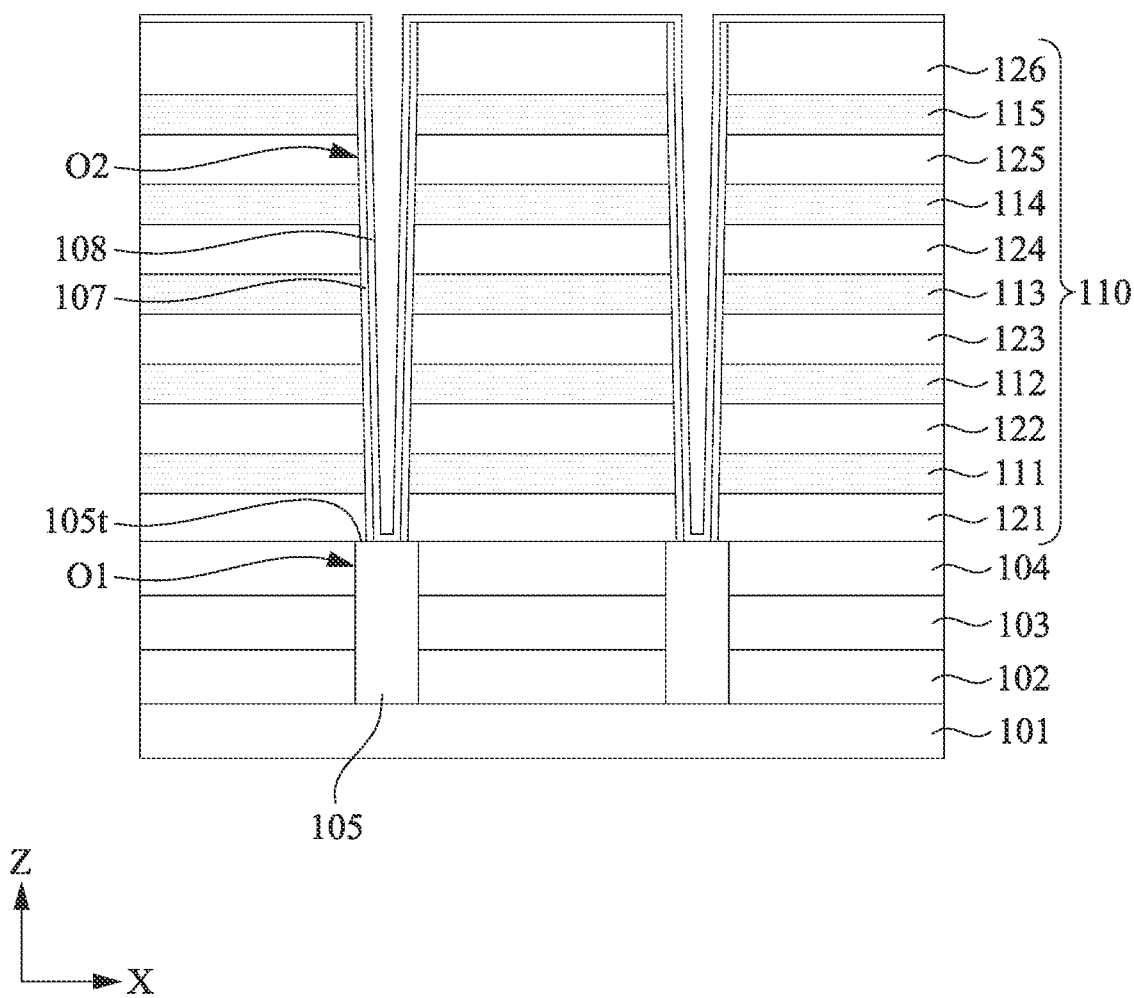

With reference to FIG. 4, a memory layer 107 and a channel layer 108 are formed in sequence on sidewalls of the through opening O2. Therefore, the memory layer 107 is disposed between the channel layer 108 and the sacrificial layers 111-115. In some embodiments, the memory layer 107 may include a composite layer having (but not limited to) oxide-nitride-oxide (ONO), oxide-nitride-oxide-nitride-oxide (ONONO) or oxide-nitride-oxide-nitride-oxide-nitride-oxide (ONONONO) structure formed to conformally blanket over the multi-layered stack 110, the sidewalls and the bottoms of the through openings O2. Subsequently, an etching process is performed to remove portions of the composite layer disposed on a top surface 110t of the multi-layered stack 110 and the bottoms of the through openings O2, such that the top surface 105t of the contact plugs 105 are exposed.

Thereafter, the channel layer 108 is conformally deposited over the memory layer 107, and thus the IC structure 100 may include a vertical channel flash memory device. The channel layer 108 is electrically in contact with the top surface 105t of the contact plugs 105. In some embodiments, the memory layer 107 may be made of semiconductor material, such as such as poly-silicon (Si), Ge or other doped/undoped semiconductor material. For example, the channel layer 108 may be made of undoped poly-silicon.

Figure 5:
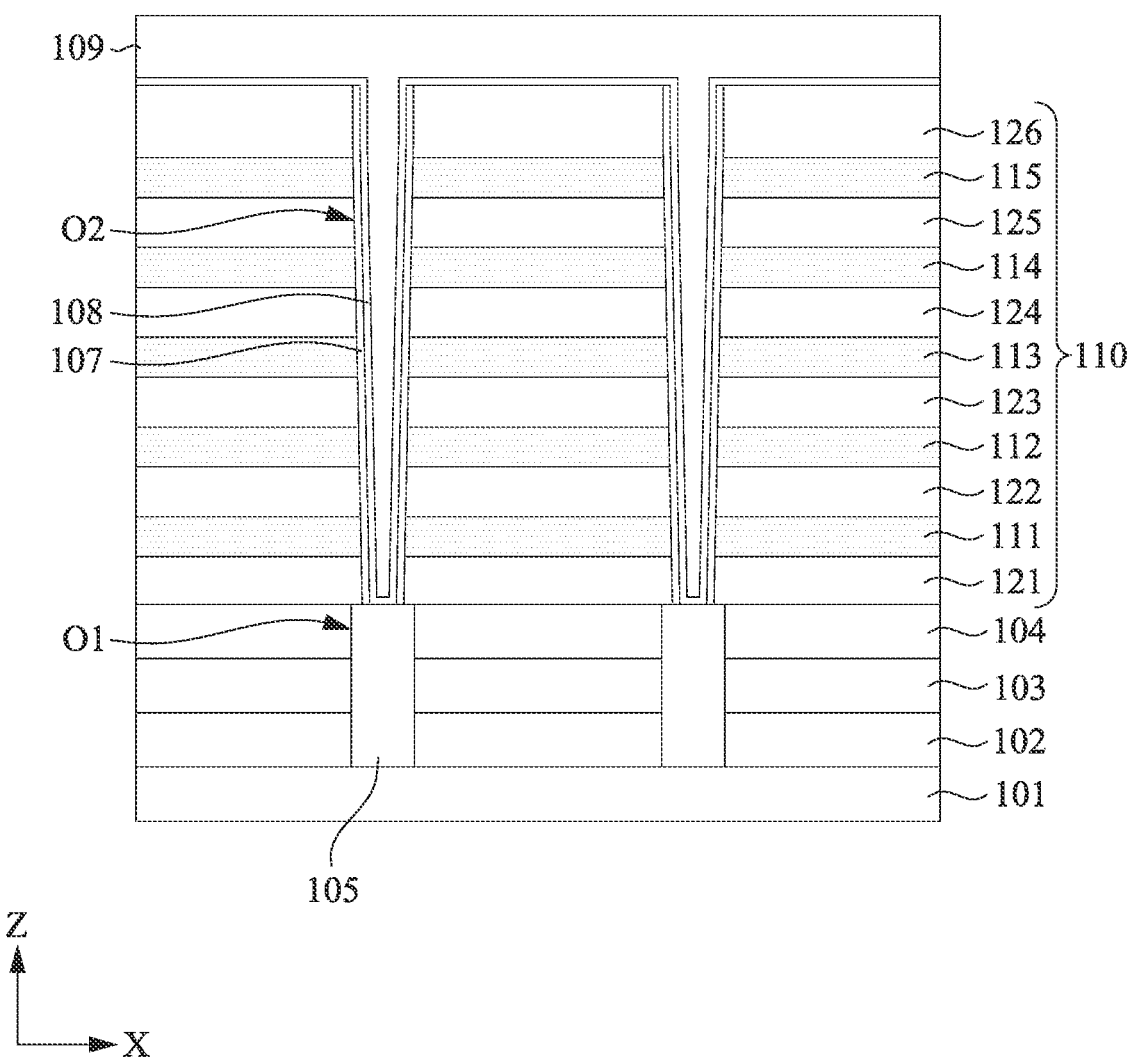

With reference to FIG. 5, a dielectric material 109 is deposited over the channel layer 108 and fills in the through openings O2. In some embodiments, the dielectric material 109 may be made of, such as silicon dioxide ($SiO_2$). In some embodiments, the dielectric material 109 may be made of a same material as the insulating layers 121-126. In some embodiments, the dielectric material 109 may be made of a different material than the insulating layers 121-126.

Figure 6:
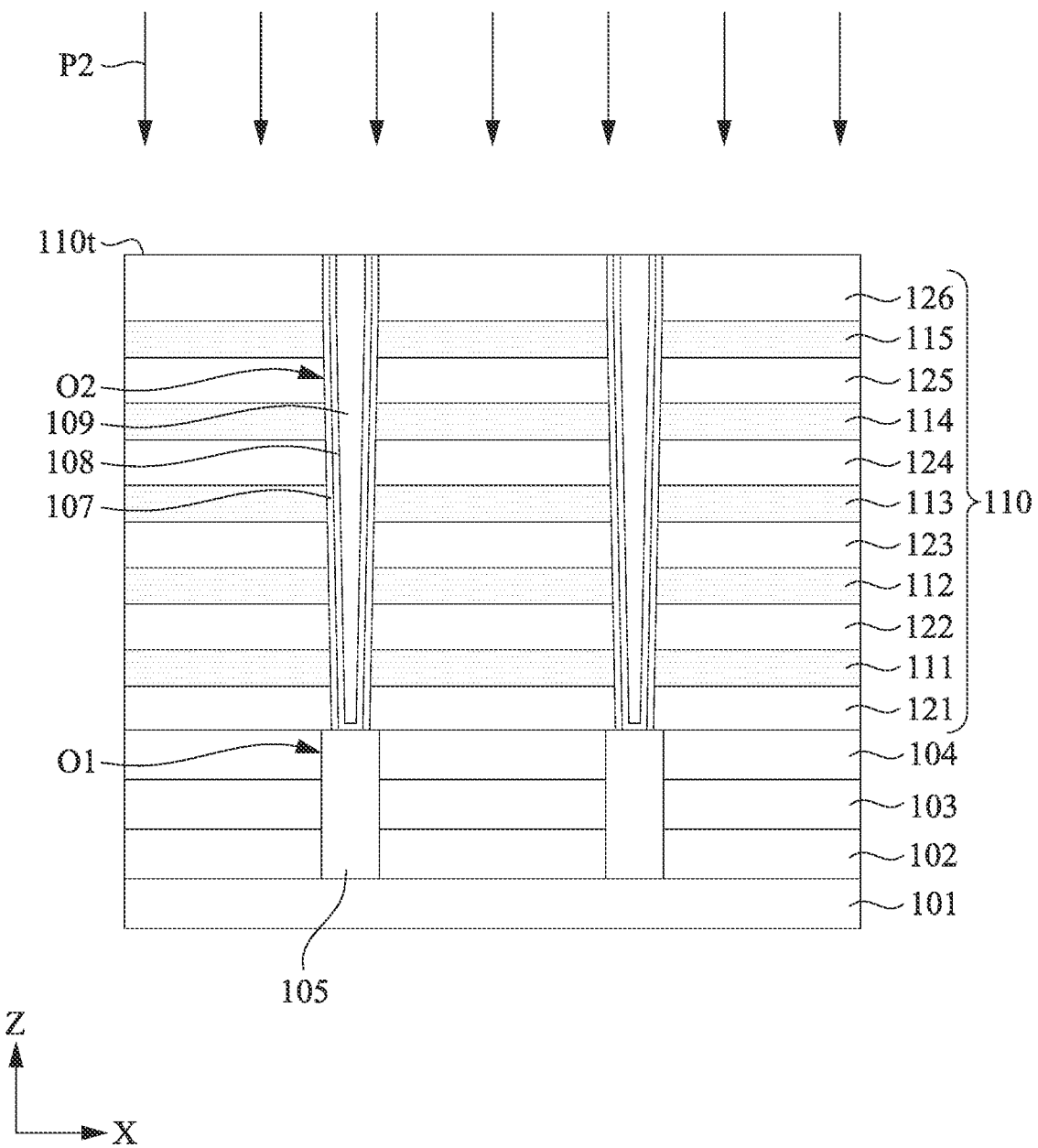

With reference to FIG. 6, a planarization process P2 (e.g., CMP) is performed to remove the excessive dielectric material 109 and channel layer 108 above the top surface 110t of the multi-layered stack 110. As a result of this method, the channel layer 108 wraps around the dielectric material 109 in the through openings O2. The memory layer 107 wraps around the channel layer 108 in the through openings O2.

Figure 7:
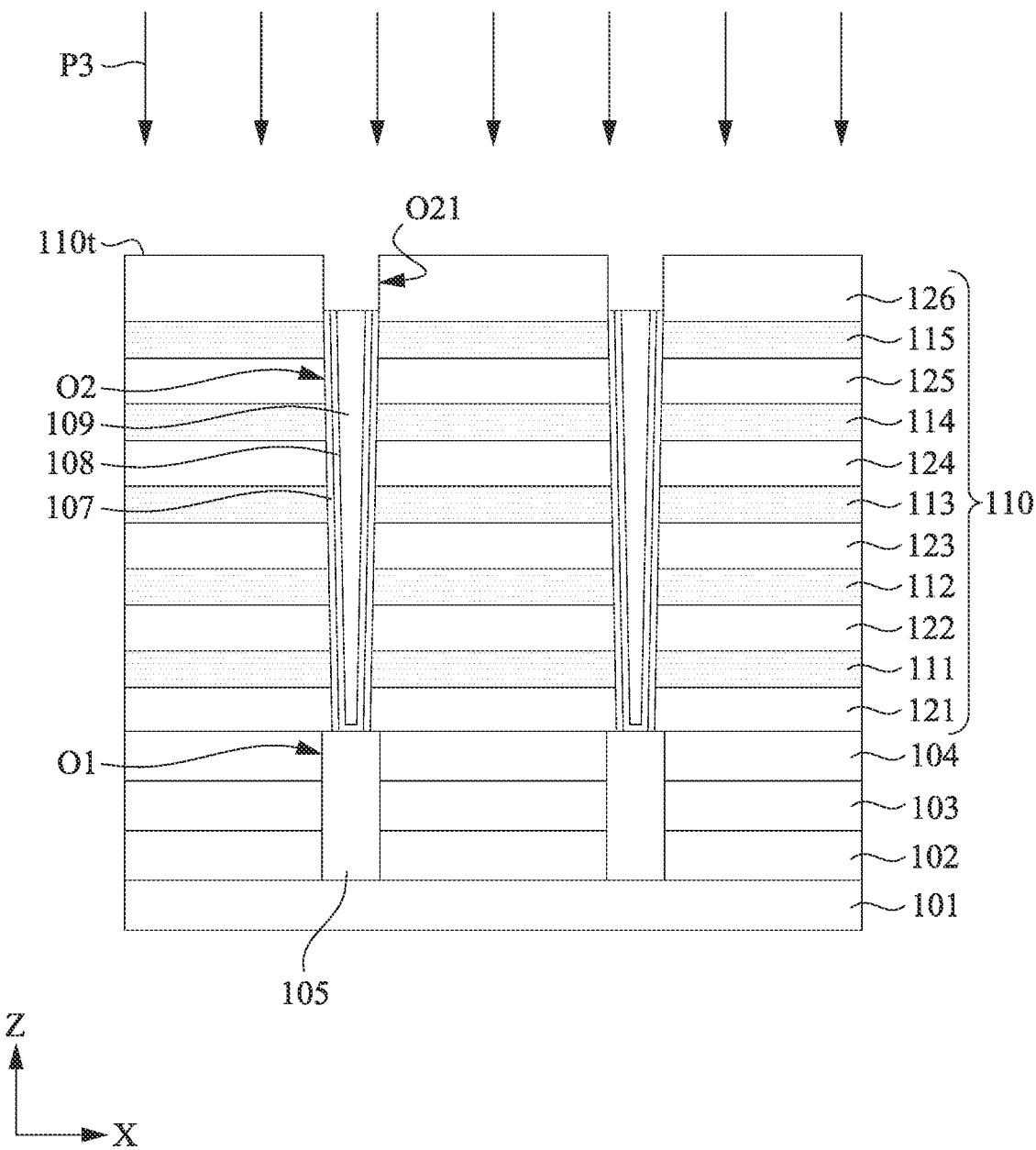

With reference to FIG. 7, an etching back process P3 is performed on the dielectric material 109, the channel layer 108, and the memory layer 107 to reappear upper portions O21 of the through openings O2. In some embodiments, the etching back process P3 may be a wet etching process, such as that in which the semiconductor substrate 101 is dipped in hydrofluoric acid (HF). In alternative embodiments, the etching back process P3 may be a dry etching process. For example, the dry etching process may be performed using $HF/NH_3$ or $NF_3/NH_3$ as the etching gas.

Figure 8:
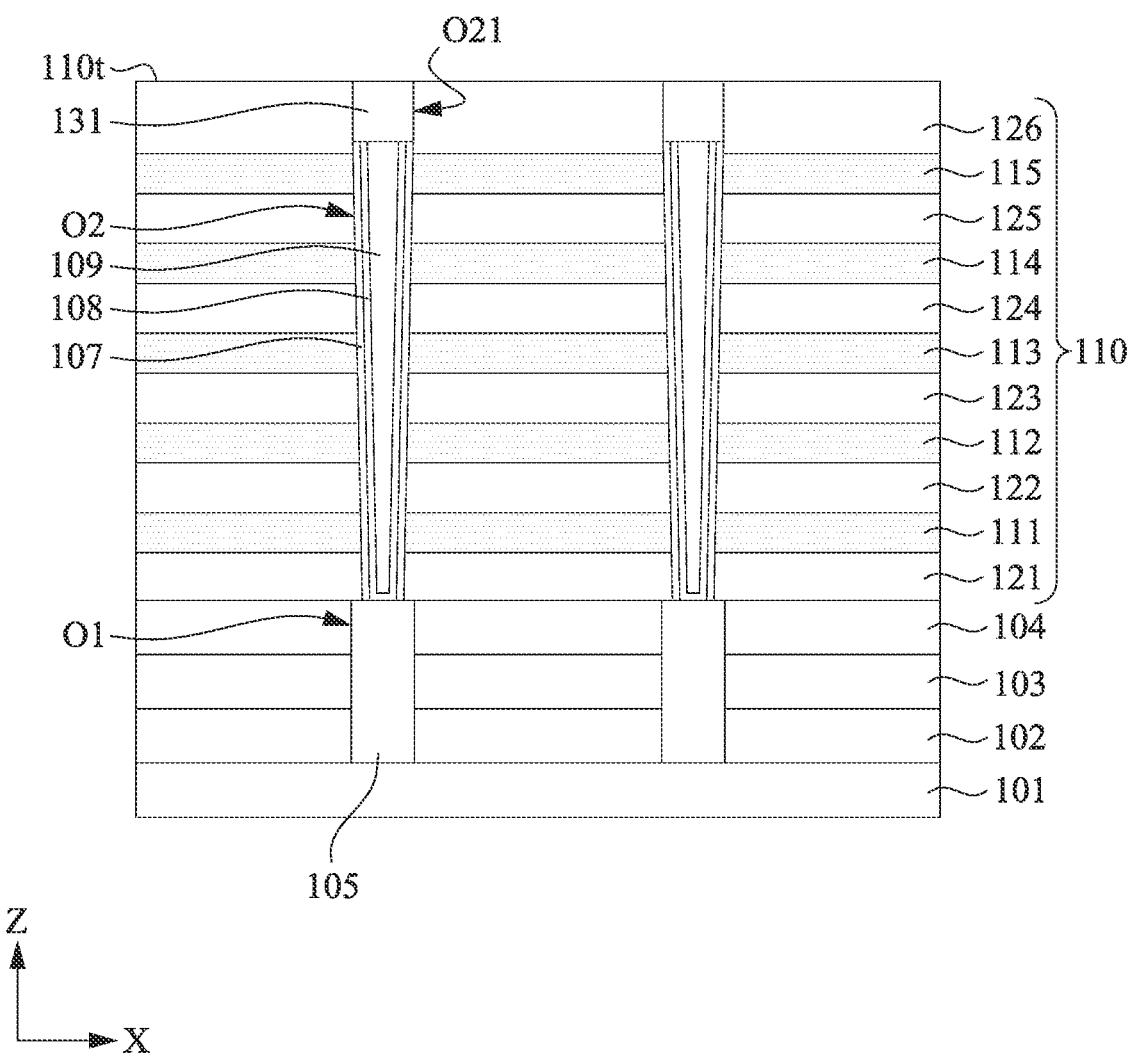

With reference to FIG. 8, bonding pads 131 are formed in the upper portions O21 of the through openings O2 and on the dielectric material 109 to form an electrical contact with the channel layer 108. In some embodiments, the bonding pads 131 are formed by depositing a poly-silicon (Si), Ge, normally, n-type dopants ($N^+$), such as phosphorus or arsenic over the multi-layered stack 110. Subsequently, a planarization process is performed to remove the excessive semiconductor material above the top surface 110t of the multi-layered stack 110. As a result of this method, the bonding pads 131 can be formed as shown in FIG. 8. In some embodiments, the bonding pad 131 can be a $P^+$ poly-silicon pad.

Figure 9:
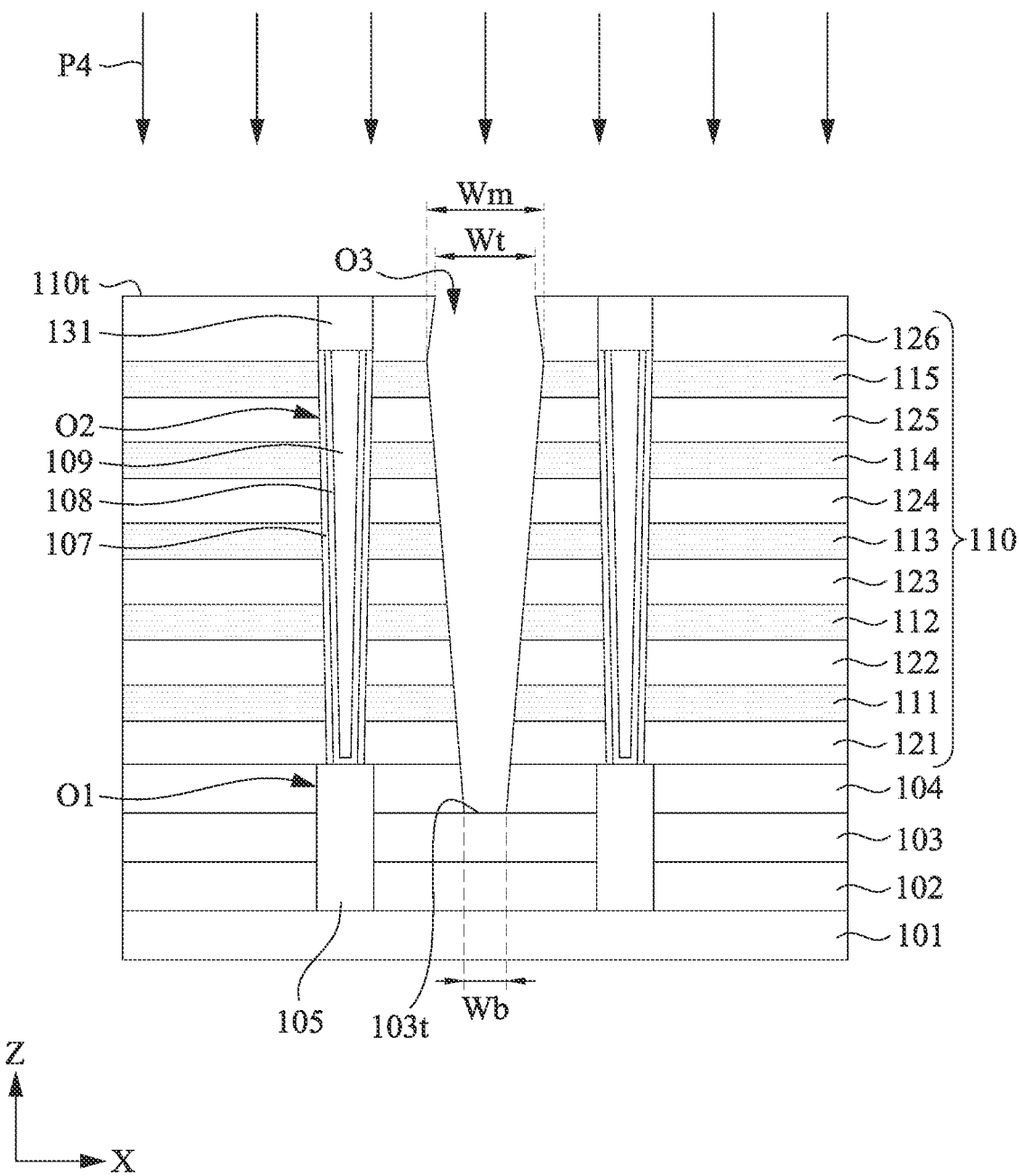

With reference to FIG. 9, an etching process P4 is performed to form a through opening O3 passing through the multi-layered stack 110 along the Z-direction and terminating at the top surface 103t of the conductive layer 103, so as to partially expose the sacrificing layers 111-115 and the insulating layers 121-126. In some embodiments, the etching process P4 can be an anisotropic etching process, such as a reactive ion etching (RIE) process, performed on the multi-layered stack 110 using a patterned hard mask layer (not shown) as an etching mask. As shown in FIG. 9, when the etching process P4 is complete, through opening O3 may be formed to have a bowl-shaped cross-sectional profile. Specifically, when viewed in a cross section, the through opening O3 may have a width increasing from a bottom level of the through opening O3 to a middle level of the through opening O3 and decreasing from the middle level of the through opening O3 to a top level of the through opening O3. In some embodiments, the through opening O3 may have a maximal width at a level of one of the sacrificial layers 111-115 and insulating layers 122-125 in the multi-layered stack 110. In some embodiments, the through opening O3 may have a maximal width Wm at the middle position of the through opening O3 that is greater than the width Wb and width Wt at the bottom and top ends of the through opening O3. In some embodiments, the maximal width Wm may at a position level with a top surface of a topmost one of the sacrificial layers 111-115. In some embodiments, the through opening O3 can be interchangeably referred to a source line trench. In some embodiments, the width can be interchangeably referred to a lateral dimension.

Figure 10:
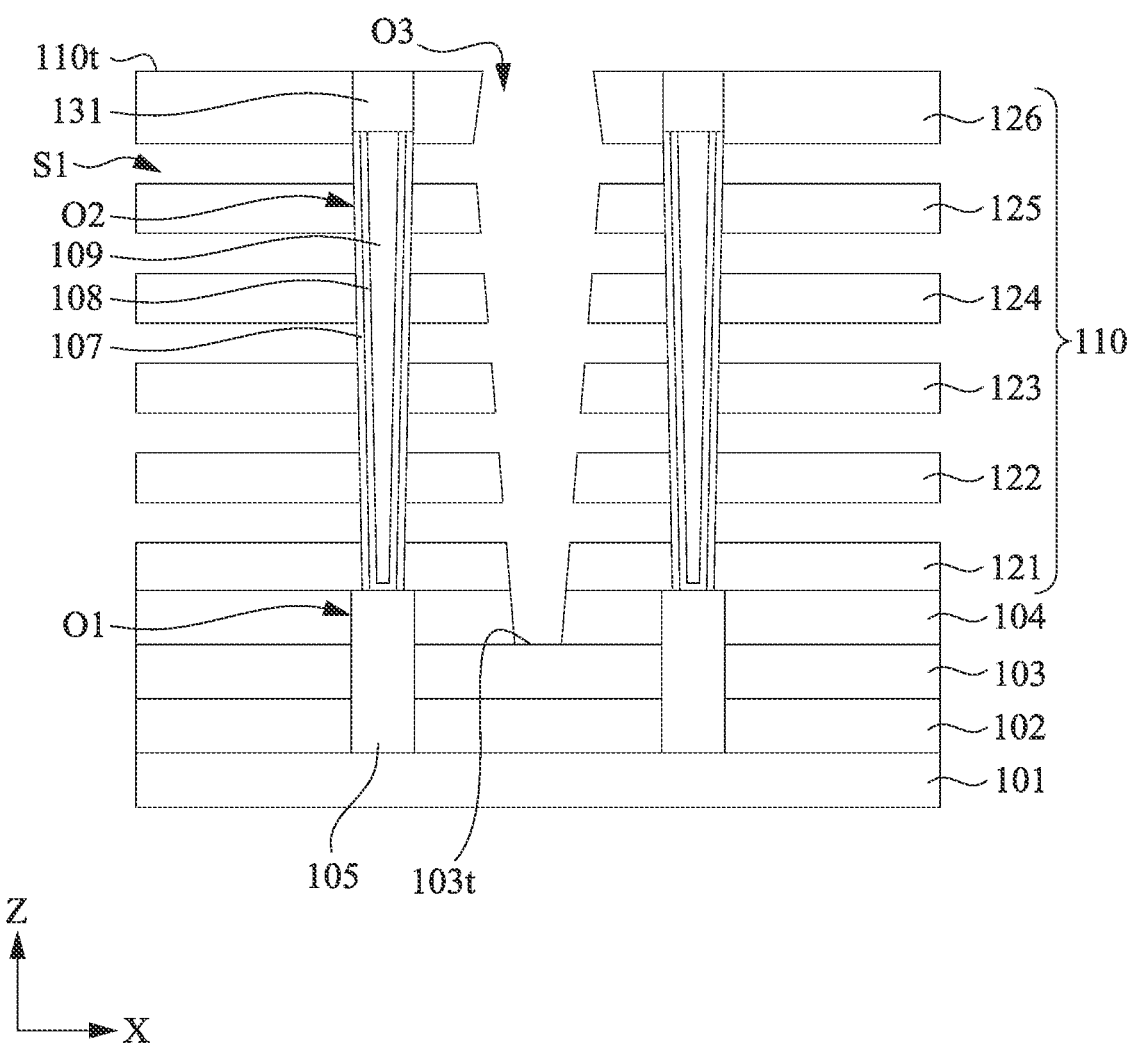

With reference to FIG. 10, the sacrificial layers 111-115 (see FIG. 9) are removed, such as using phosphoric acid ($H_3PO_4$) solution, through the through opening O3 to expose portions of the memory layer 107. Therefore, spaces S1 are formed to inherit the shapes of the sacrificial layers 111-115.

Figure 11:
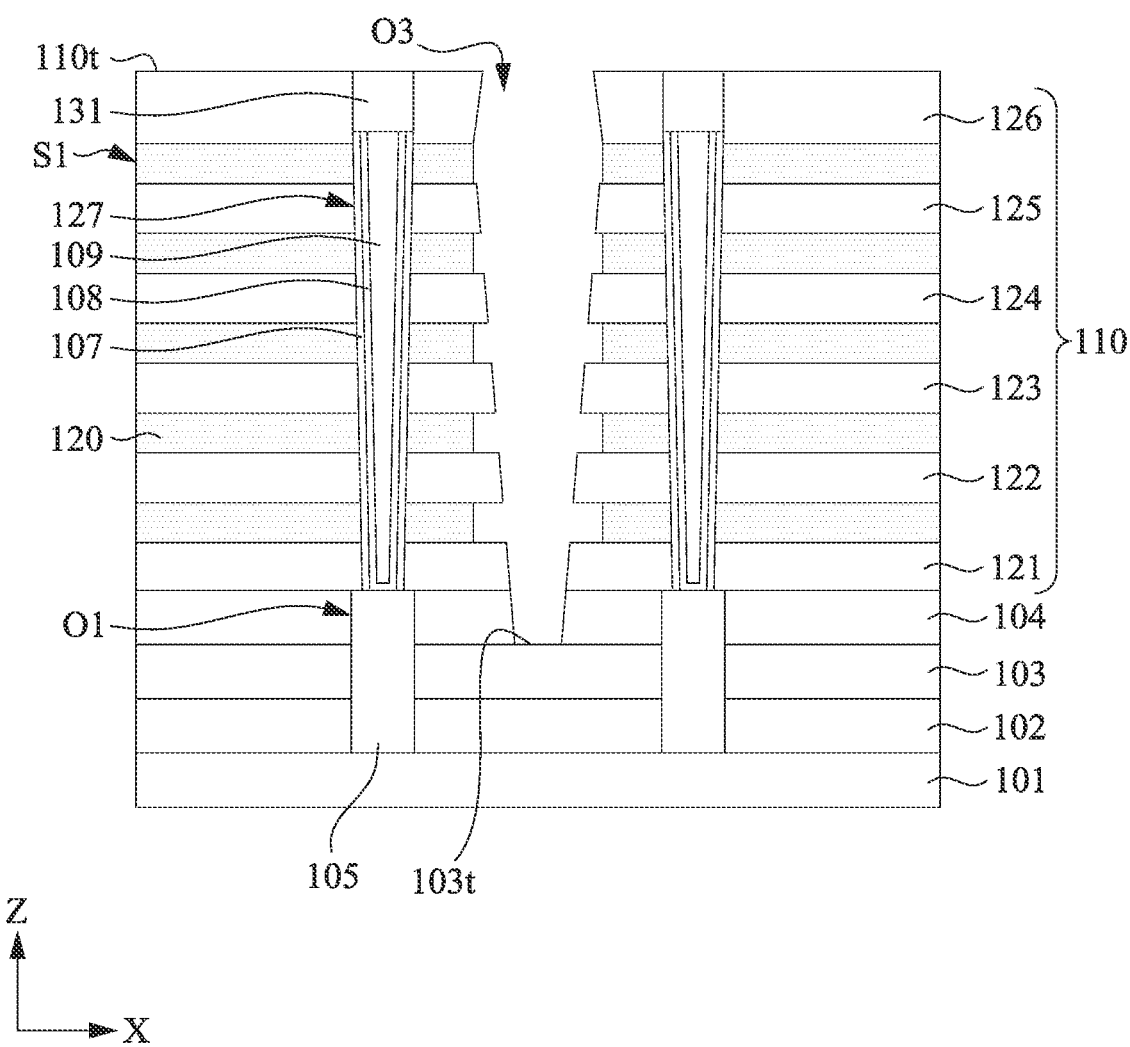

With reference to FIG. 11, a plurality of gate layers 120 are formed in the spaces S1 through the through opening O3. As a result, a plurality of memory cells 127 can be defined at the points of intersection between the gate layers 120, the memory layer 107, and the channel layer 108, so as to form a memory cell array in the multi-layered stack 110. In some embodiments, the memory cells 127 can be interchangeably referred to memory devices. In some embodiments, the gate layers 120 may include poly-silicon, metal or other suitable conductive material. In some embodiments, the gate layers 120 may include metal layers, such as TiN/W, TaN/W, TaN/Cu, or the like. In some embodiments, the gate layers 120 may include dielectric layer, such as $AlO_x$. For example, each of the gate layers 120 can be a multi-layered structure including a high-K material layer (e.g., $HfO_x$ layer or $AlO_x$ layer), a TiN layer, and a tungsten layer. In some embodiments, a lateral end of at least one of the gate layers 120 may be recessed toward the memory layer 107.

Figure 12:
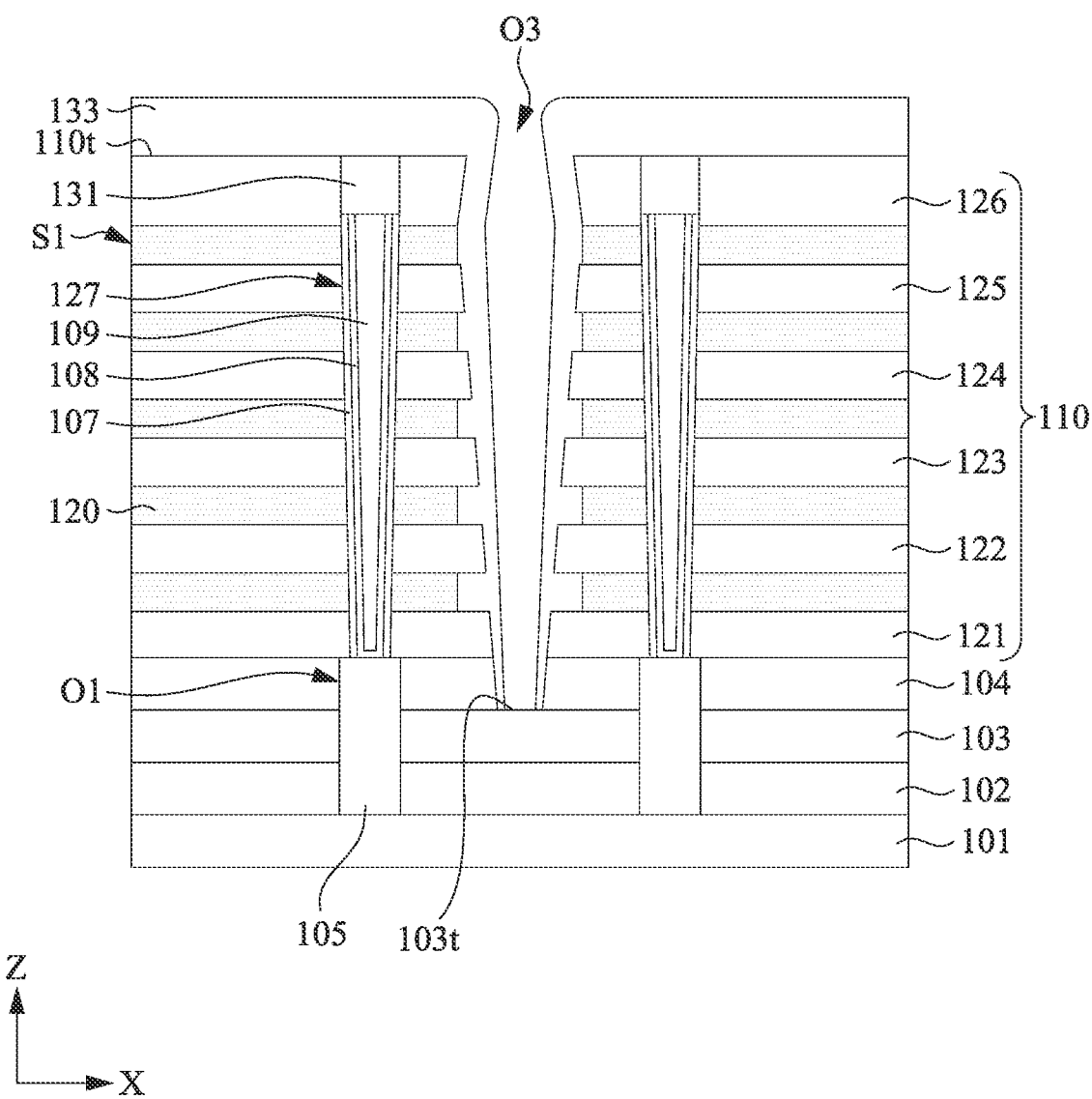

With reference to FIG. 12, a dielectric material 133 is deposited over the multi-layered stack 110 and fills in the through opening O3 to line the sidewalls of the through opening O3. In some embodiments, the dielectric material 133 may be made of, such as silicon oxide, silicon nitride (SiN), silicon oxynitride (SiON), silicate, combinations thereof, or other suitable dielectric materials. In some embodiments, the dielectric material 133 may be made of a same material as the insulating layers 121-126. In some embodiments, the dielectric material 133 may be made of a different material than the insulating layers 121-126. Subsequently, an etching process is performed to remove a portion of the dielectric material 133 disposed on the top surface 103t of the conductive layer 103, such that the conductive layer 103 is exposed.

Figure 13:
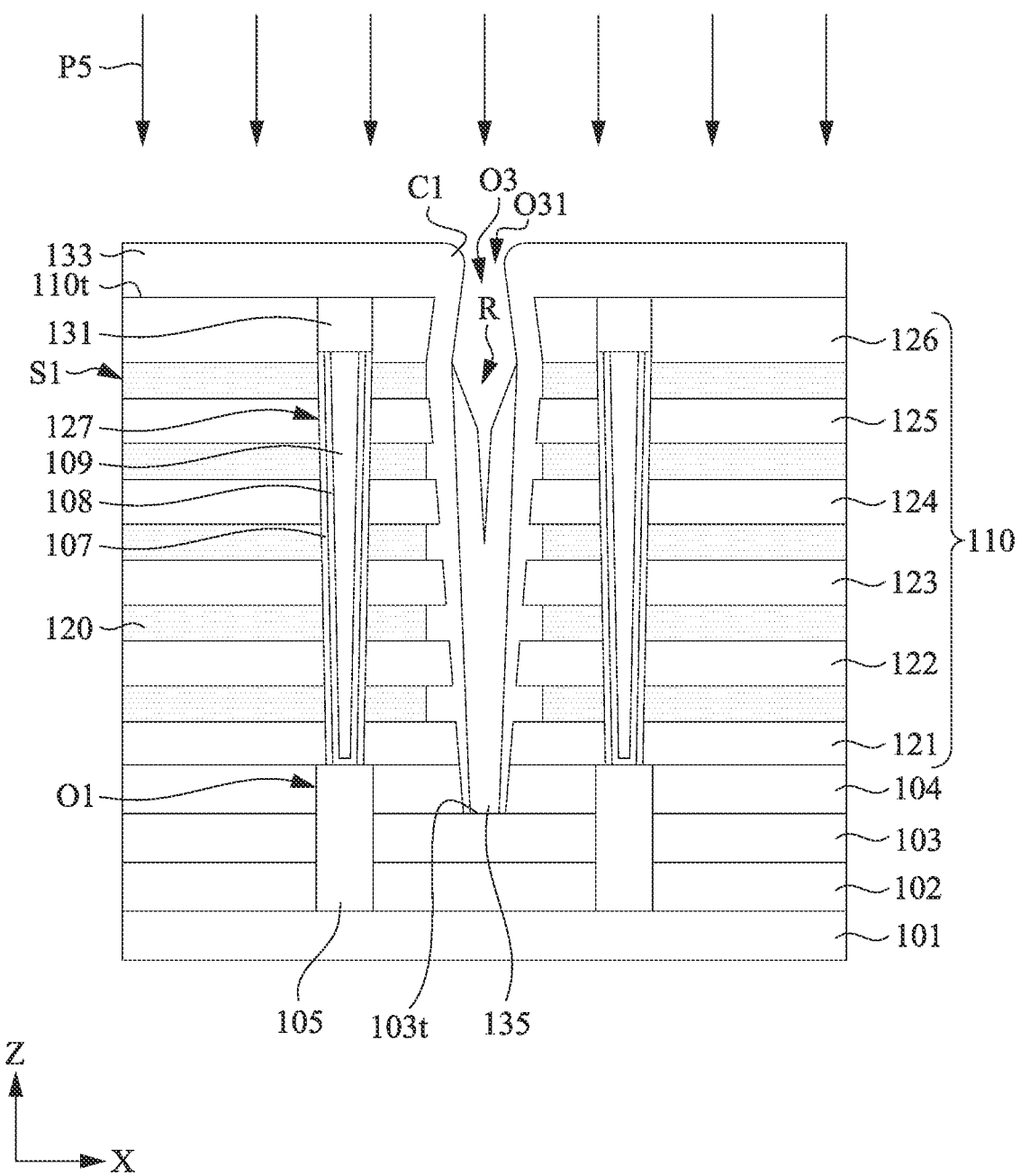

With reference to FIG. 13, a bonding pad 135 is formed in the bottom portion of the through opening O3 to form an electrical contact with the conductive layer 103. In some embodiments, the bonding pad 135 is formed by depositing a poly-silicon (Si), normally, n-type dopants (N), such as phosphorus or arsenic over the multi-layered stack 110. Subsequently, a planarization process is performed to remove the excessive semiconductor material above the top surface 110t of the multi-layered stack 110. Subsequently, an annealing process may be performed on the bonding pad 135. Subsequently, an etching back process P5 is performed on the bonding pad 135 to reappear the upper portion O31 of the through opening O3. In some embodiments, the etching back process P5 may be a wet etching process, such as that in which the semiconductor substrate 101 is dipped in hydrofluoric acid (HF). In alternative embodiments, the etching back process P5 may be a dry etching process. For example, the dry etching process may be performed using $HF/NH_3$ or $NF_3/NH_3$ as the etching gas. As a result of this method, the bonding pad 135 can be formed as shown in FIG. 13. In some embodiments, the bonding pad 135 can be a $P^+$ poly-silicon pad. In some embodiments, the bonding pad 135 has a recess R at its top surface due to nature of deposition.

Figure 14A:
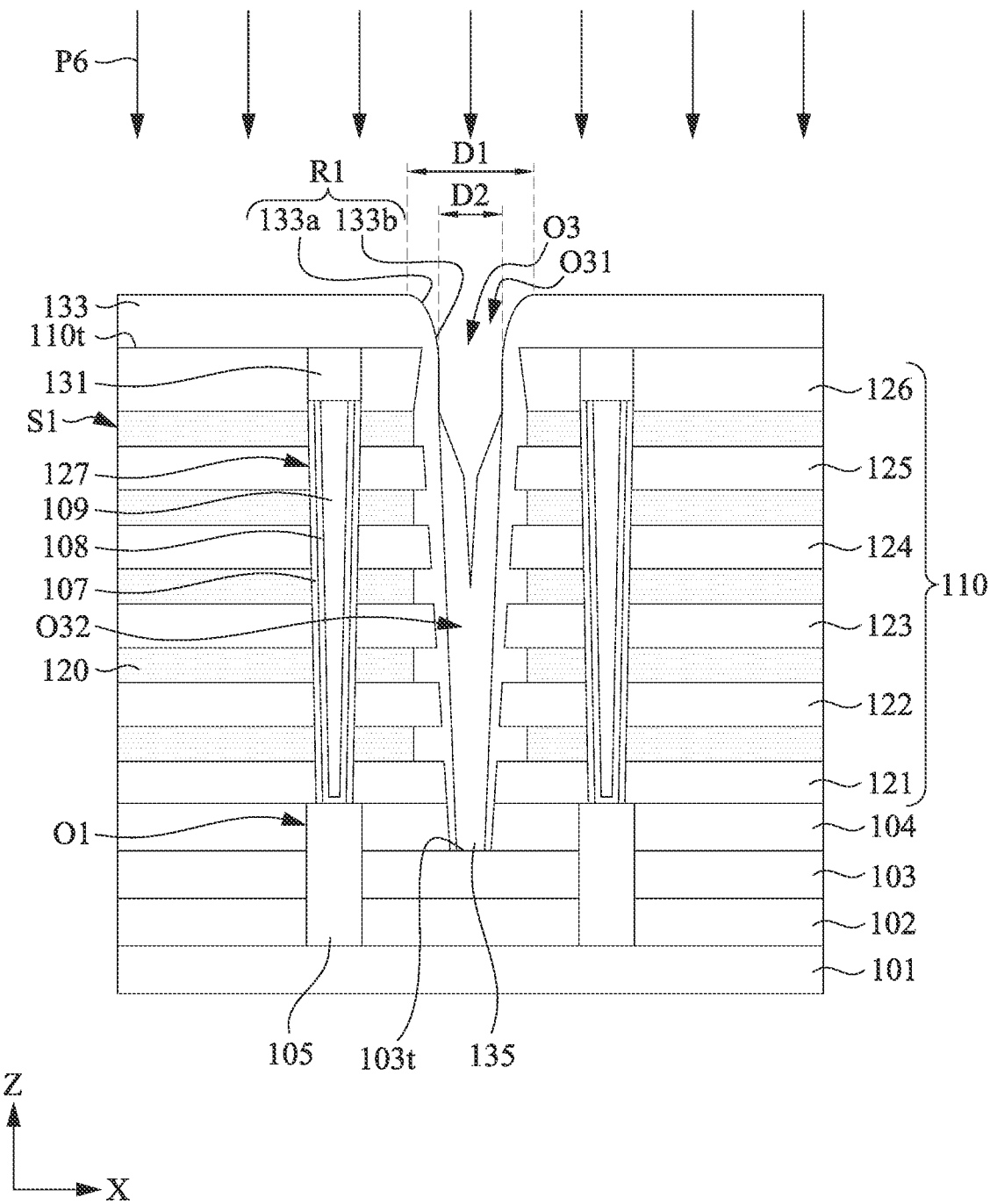
Figure 15A:
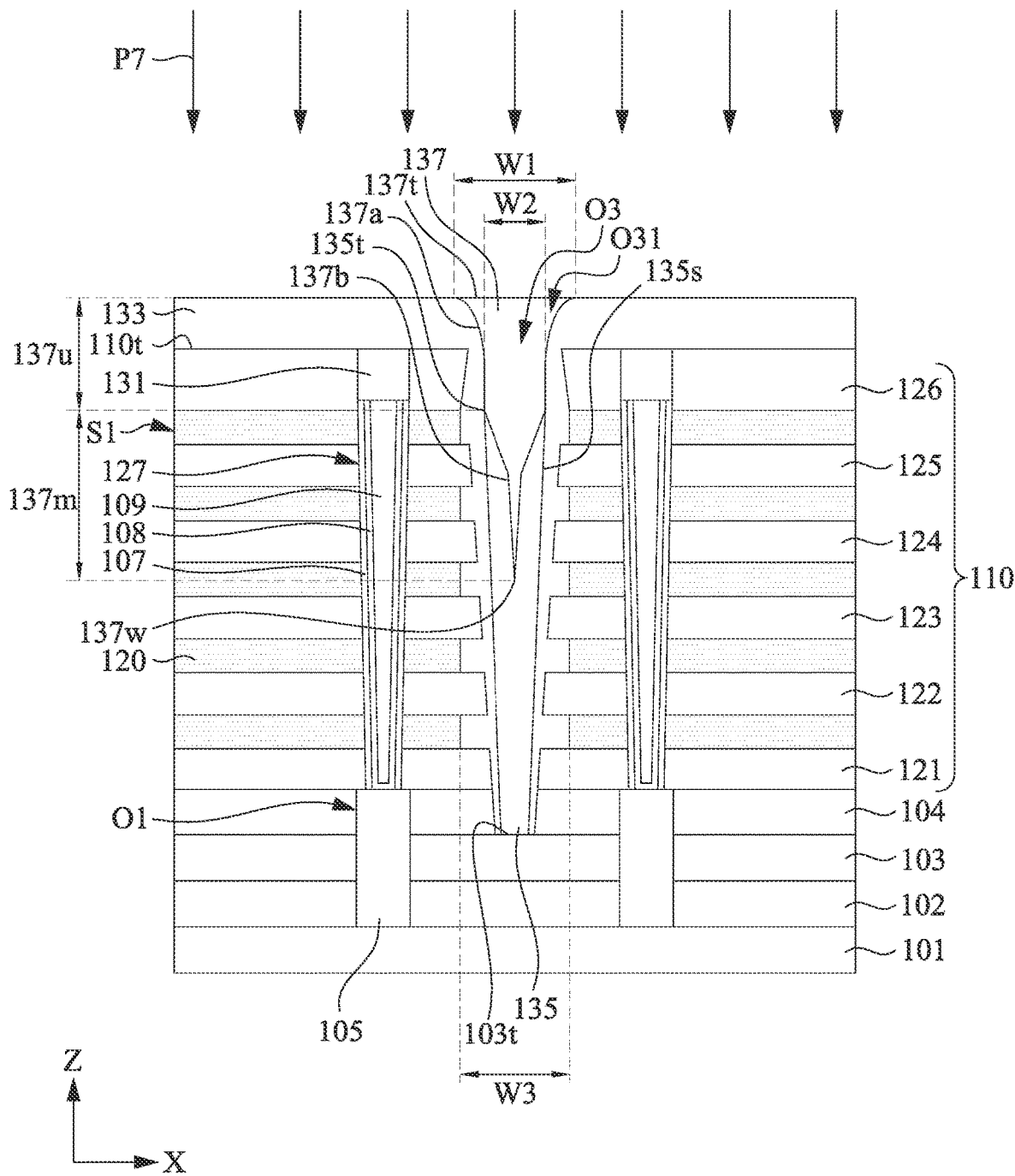

With reference to FIG. 14A, a dry etching process P6 is performed on the dielectric material 133 to remove a tip corner C1 (see FIG. 13) of the dielectric material 133 adjacent to the through opening O3, such that a lateral diameter D1 of the upper portion O31 of the through opening O3 can be enlarged, which in turn improves a gap fill window of one or more following deposition process (e.g., process for forming the metal plug 137 as shown in FIG. 15A in the through opening O3), and prevents a seam formed therein. In some embodiments, the dry etching process P6 can be interchangeably referred to a top widen etching process. In some embodiments, the tip corner C1 can be interchangeably referred to an overhang.

If the lateral diameter D1 of the upper portion O31 of the through opening O3 is less than a lateral dimension D2 of the through opening O3 in a position level with a topmost end of the bonding pad 135 (e.g., a through opening having a bowl-shaped profile), a gap fill window of the through opening O3 may be too small for the following deposition process to fit inside a through opening having the bowl-shaped profile, such that a seam may be formed in a metal plug formed subsequently in the through opening O3. After a planarization process preformed on the metal plug, an etching gas (e.g., Fluorine) would be trapped/stuck in the seam and impact the following manufacturing process (e.g., fluorine leakage).

Therefore, this disclosure provides a method that can prevent a seam formed in the metal plug laid in the through opening O3. Specifically, the dry etching process P6 is performed by introducing a high-polymeric etching gas into a process chamber having the semiconductor substrate 101 therein. After the high-polymeric chemistry is introduced into the process chamber, a plasma is struck. The dry etching process P6 moves ions within the plasma up and down in relation to the surface of the semiconductor substrate 101. In some embodiments, a wafer support structure below the semiconductor substrate 101 acts as one plate of a capacitive coupling structure, while the conductive plasma above the semiconductor substrate 101 provides the complimentary electrode. A radio frequency (RF) bias power of the dry etching process P6 electrically connected to the wafer support structure creates an electric field orthogonal to a surface of the semiconductor substrate 101 that can accelerate plasma ions into and away from the surface of the semiconductor substrate 101. The ions sputter etch the surface of the semiconductor substrate 101 by physically bombarding the surface to remove the tip corner C1 (see FIG. 13) of the dielectric material 133.

In some embodiments, the dry etching process P6 can be a plasma etching process that uses the high-polymeric gas, such as carbon fluoride ($C_xF_y$), with oxygen ($O_2$) and argon and is performed under a low pressure, which in turn increases vertically downward plasma strikes upon the dielectric material 133 to enlarge the upper portion O31 of the through opening O3 while only minimally removing the lower portion of the dielectric material 133 in the through opening O3. Therefore, a bias between the upper portion O31 and the lower portion O32 of the through opening O3 can be increased to improve a gap fill window of the following deposition process. By way of example but not limiting the present disclosure, the lateral dimension D1 of the through opening O3 may be greater than at least 1.5 times a width of the lateral dimension D2 of the through opening O3 in a position level with a topmost end of the bonding pad 135.

In some embodiments, the high-polymeric gas, such as carbon fluoride ($C_xF_y$) gas, where x and y are integers and y/x is less than about 3, may provide more plasma species for sputter etching on the upper level of the dielectric material 133. In some embodiments, the carbon fluoride gas may include $C_4F_8$, $C_4F_8$, $C_5F_8$, $C_3F_8$, or combinations thereof. In some embodiments, the etching gas used in the dry etching process P6 may be different than the etching gas used in the etching back process P5 (see FIG. 13) and/or the etching process P4 (see FIG. 9). During the etching process, a flow rate of the high-polymeric gas of the dry etching process P6 flowed into the process chamber may be in a range from about 20 to 50 sccm (e.g. 20, 30, 40, or 50 sccm), and a low rate of argon of the dry etching process P6 flowed into the process chamber may be in a range from about 200 to 500 sccm (e.g. 200, 250, 300, 350, 400, 450, or 500 sccm).

In some embodiment, the dry etching process P6 may be performed at a pressure in a range from about 10 to 100 mt (e.g., about 10, 20, 30, 40, 50, 60, 70, 80, 90, or 100 mt). In some embodiments, the dry etching process P6 may be performed at a pressure lower than the etching back process P5 (see FIG. 13) and/or the etching process P4 (see FIG. 9). In some embodiment, the dry etching process P6 may be performed in a time duration greater than about 15 seconds. During the dry etching process P6, the plasma may be formed by turning on a top RF source generator with a frequency in a range from about 1 to 3 MHz (e.g., 1, 1.5, 2, 2.5, or 3 MHz) and a power level in a range from about 800 to 1200 (e.g., 800, 900, 1000, 1100, or 1200 W), and turning on a RF bias generator with a frequency in a range from about 25 to 35 MHz (e.g., 25, 27, 30, 35 MHz) and a RF bias power level in a range from about 3000 to 4000 W (e.g., 3000, 3500, or 4000 W). In some embodiment, increasing the RF bias power level of the RF bias generator can increase a difference between widths of the upper portion O31 and the lower portion O32 of the through opening O3, such that a gap fill window of the following deposition process can be improved.

Therefore, the dry etching process P6 can inhibit overhangs formed on the resulting dielectric material 133 compared with the case where without performing the dry etching process P6, which in turn improves a gap fill window of one or more following deposition process (e.g., process for forming the metal plug 137 as shown in FIG. 15A). The sputter etch in the dry etching process P6 may result in a round corner R1 formed on the dielectric material 133, the round corner R1 including a curved facet 133a and a lower slant facet 133b having a steeper slope than the curved facet 133a. The curved facet 133a and the lower slant facet 133b are formed such that a remainder of the upper portion O31 of the through opening O3 in the dielectric material 133 widens as it extends away from the bonding pad 135, thus improving the gap fill window of one or more following deposition process. In some embodiments, the remainder of the upper portion O31 of the through opening O3 in the dielectric material 133 as shown in FIG. 14A can be interchangeably referred to a red wine glass-shaped profile. In some embodiments, this disclosure can be applied into other dielectric or conductance etch in DARM, Nor-flash, and NAND flash.

With reference to FIG. 15A, a metal plug 137 is formed in the upper portion O31 of the through opening O3. Specifically, a conductive material is deposited over the multi-layered stack 110 and fills in the through opening O3. Subsequently, a planarization process P7 (e.g., CMP) is performed to remove the excessive conductive material above the top surface 110t of the multi-layered stack 110. As a result of this method, the metal plug 137 is formed in the through openings O3. The metal plug 137 can be electrically insulated from the gate layers 120 by the dielectric material 133 and electrically contact to the conductive layer 103 through the bonding pad 135. In some embodiments, the metal plug 137 can be interchangeably referred to a source line. In some embodiments, the metal plug 137 may be made of TiN, TaN, Ti, Ta, Cu, Al, Ag, W, Ir, Ru, Pt, combinations thereof, or other suitable conductive materials.

The metal plug 137 extends upwardly from the bonding pad 135 and has a lower portion 137m and an upper portion 137u. The lower portion 137m of the metal plug 137 is inlaid in the bonding pad 135. In some embodiments, the upper portion 137u of the metal plug 137 may have an upper concave sidewall 137a, and the lower portion 137m of the metal plug 137 may have a lower concave sidewall 137b. The upper concave sidewall 137a of the upper portion 137u of the metal plug 137 may be coterminous with a sidewall 135s of the bonding pad 135. The metal plug 137 may have a width increasing from a bottom 137w end thereof to a top end 137t thereof. The top end 137t of the metal plug 137 has a width W1 greater than a width of the bonding pad 135. In some embodiments, the width W1 of the top end 137t of the metal plug 137 may be greater than at least 1.5 times a width W2 of the metal plug 137 at a position level with a top end 137t of the bonding pad 135. In some embodiments, the top end 137t or the upper portion 137u of the metal plug 137 may overlap the gate layers 120. In some embodiments, the top end 137t of the metal plug 137 may have a lateral dimension greater than a maximum lateral dimension of the through opening O3. In some embodiments, the metal plug 137 is seam-free. The dielectric material 133 laterally surrounds the metal plug 137 and the bonding pad 135. In some embodiments, the width W1 of the top end 137t of the metal plug 137 may be greater than a width W3 of dielectric material 133 on the bonding pad 135. In some embodiments, the upper portion 137u of the metal plug 137 may overlap the insulating layers 122-125.

Figure 16:
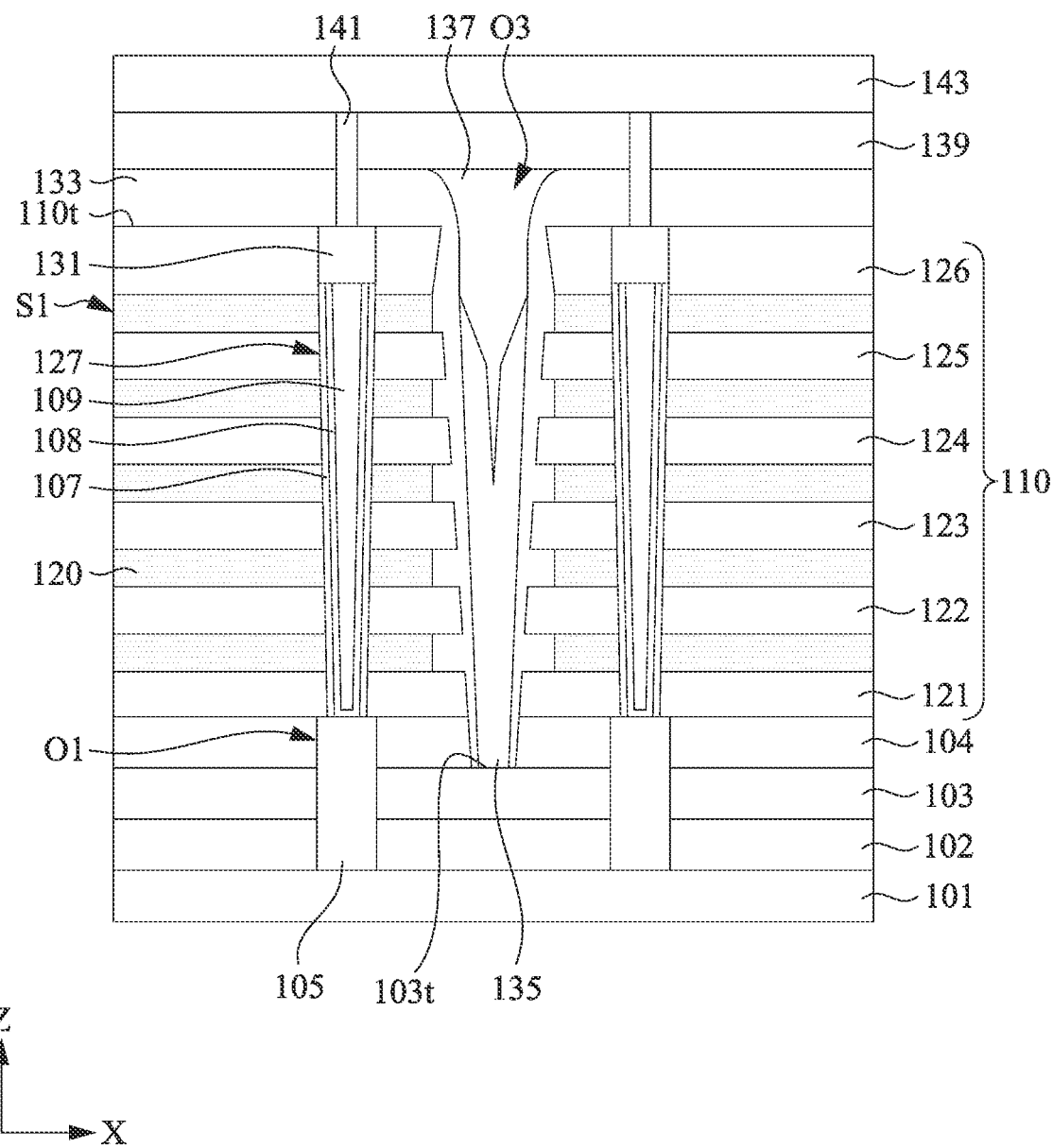

With reference to FIG. 16, an inter-layer dielectric (ILD) layer 139 is then formed over the dielectric material 133 and the metal plug 137. Subsequently, a plurality of bit lines 143 electrically connected to the bonding pads 131 with an interconnection via 141 formed in the ILD layer 139. Subsequently, after a series of back end of line (BEOL) processes (not shown) are carried out, the integrated circuit (IC) structure 100 including a plurality of memory cells 127 is formed as shown in FIG. 16. In some embodiments, the memory cells 127 defined by the gate layers 120, the memory layer 107, and the channel layer 108 can be electrically coupled to a decoder, such as a row decoder or a column decoder (not shown), through the bit lines 143. A current coming from the bit lines 143 can flow to the earth by passing through the channel layer 108, the contact plug 105, the conductive layer 103 (serving as the bottom common source line), the bonding pad 131, and the metal plug 134. In other words, the current path for performing the read/program operation does not flow through the semiconductor substrate 101. Therefore, the current path for performing the read/program operation can be decreased, such that the operation resistance and power consumption of the memory device can be reduced.

In some embodiments, the ILD layer 139 may be made of silicon oxide, silicon nitride (SiN), silicon oxynitride (SiON), silicate, combinations thereof, or other suitable dielectric materials. In some embodiments, the bit line 143 may be made of TiN, TaN, Ti, Ta, Cu, Al, Ag, W, Ir, Ru, Pt, combinations thereof, or other suitable conductive materials. In some embodiments, the interconnection via 141 may be made of TiN, TaN, Ti, Ta, Cu, Al, Ag, W, Ir, Ru, Pt, combinations thereof, or other suitable conductive materials.

Figure 14B:
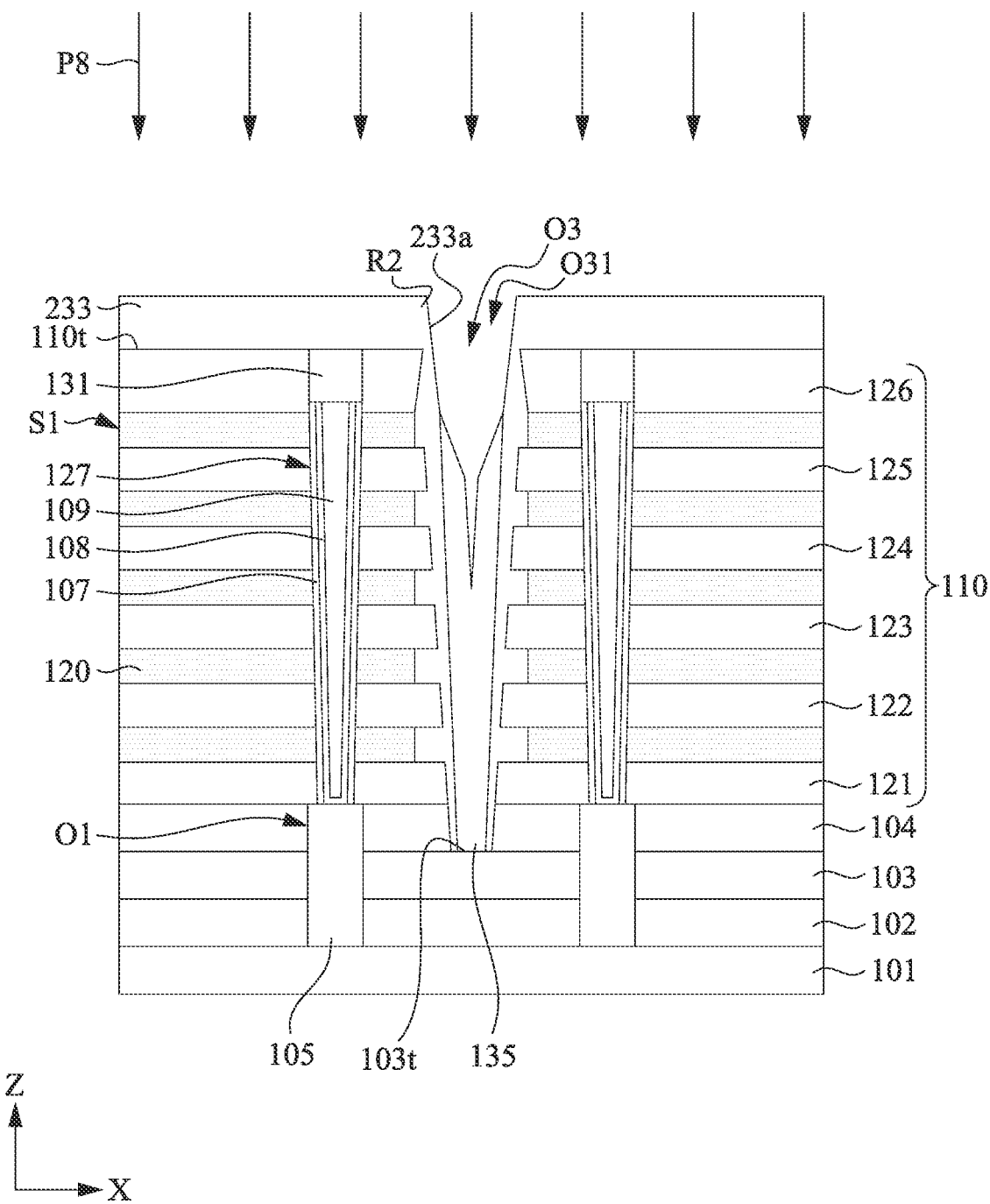
FIGS. 14B and 15B are cross-sectional views illustrating a method for manufacturing an IC structure in different stages in accordance with some embodiments.
Figure 15B:
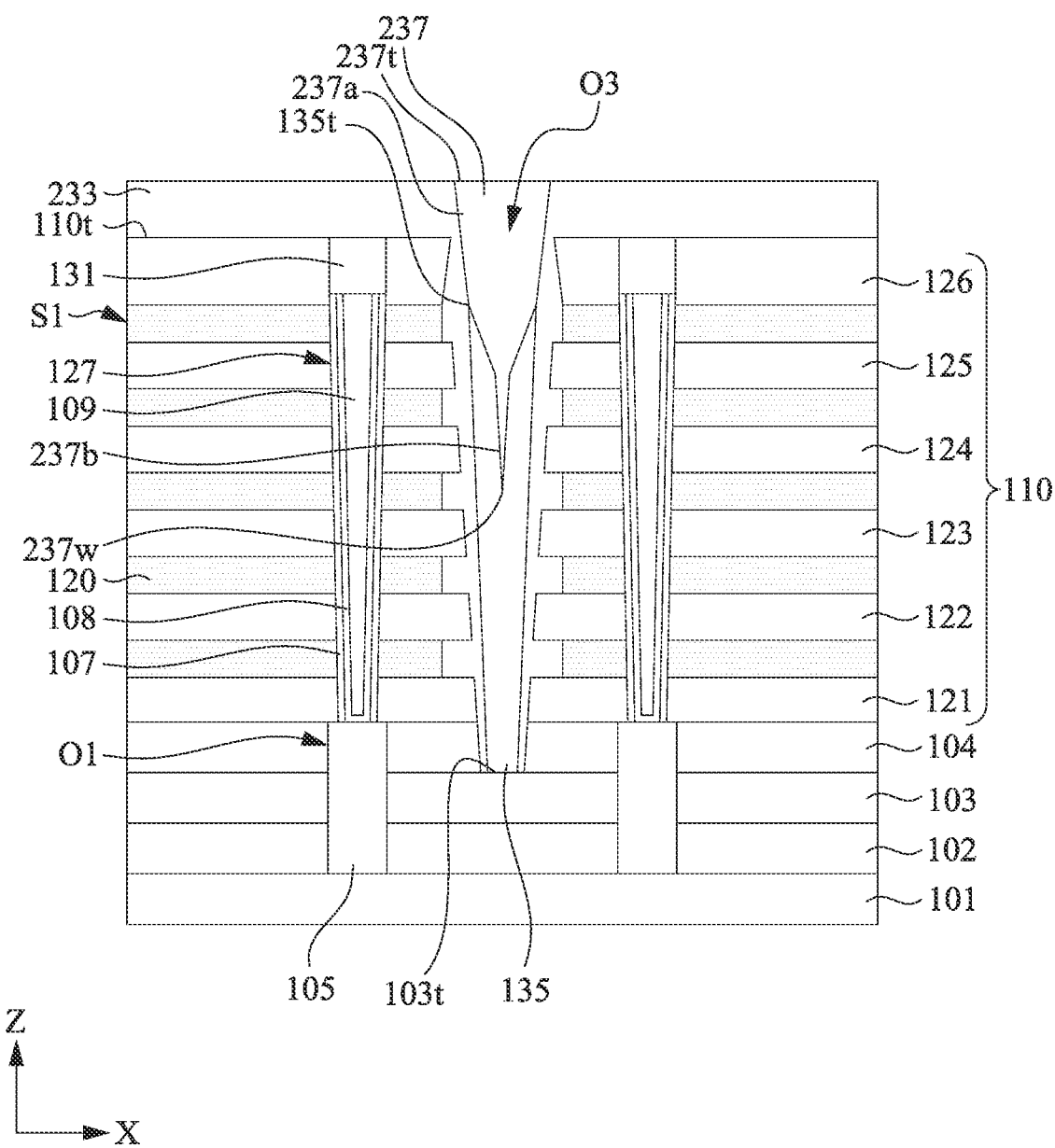

FIGS. 14B and 15B are cross-sectional views illustrating a method for manufacturing an IC structure 200 in different stages in accordance with some embodiments. Operations for forming the IC structure 200 are substantially the same as the operations for forming the IC structure 100 described in foregoing descriptions and thus are not repeated herein for the sake of clarity. FIGS. 14B and 15B illustrates a different profile of the metal plug 237 than FIGS. 1-13, 14A, 15A, and 16.

FIG. 14B illustrates the IC structure 200 at a stage corresponding to FIG. 14A according to some alternative embodiments of the present disclosure. As shown in FIG. 14B, a dry etching process P8 can be a plasma etching process that uses a high-polymeric gas and is performed under a low pressure to increase downward plasma strikes upon the dielectric material 233. The etching gas may include a high-polymeric gas, such as $C_4F_8$, $C_4F_8$, $C_6F_8$, $C_3F_8$, or combinations thereof. The dry etching process P8 can inhibit overhangs formed on the resulting dielectric material 233 compared with the case where without performing dry etching process P8, which in turn improves a gap fill window of one or more following deposition process (e.g., process for forming the metal plug 237 as shown in FIG. 15B). The sputter etch in the dry etching process P8 may result in a tip corner R2 formed on the dielectric material 233, the tip corner R2 including a slant facet 233a. The slant facet 233a is formed such that a remainder of the upper portion O31 of the through opening O3 in the dielectric material 233 widens as it extends away from the bonding pad 135, thus improving the gap fill window of one or more following deposition process. In some embodiments, the remainder of the upper portion O31 of the through opening O3 in the dielectric material 233 as shown in FIG. 14B can be interchangeably referred to an angle-shaped profile.

FIG. 15B illustrates the IC structure 200 at a stage corresponding to FIG. 15A according to some alternative embodiments of the present disclosure. As shown in FIG. 15B, the metal plug 237 may have an upper slant sidewall 237a and a lower concave sidewall 237b. The metal plug 237 may have a width increasing from a bottom end 237w thereof to a top end 237t thereof. Specifically, a width of the top end 237t of the metal plug 237 may be greater than at least 1.5 times a width of the metal plug 237 at a position level with a top end 135t of the bonding pad 135. In some embodiments, the top end 237t of the metal plug 237 may have a lateral dimension greater than a maximum dimension of the through opening O3. In some embodiments, the metal plug 237 is seam-free.

Figure 14C:
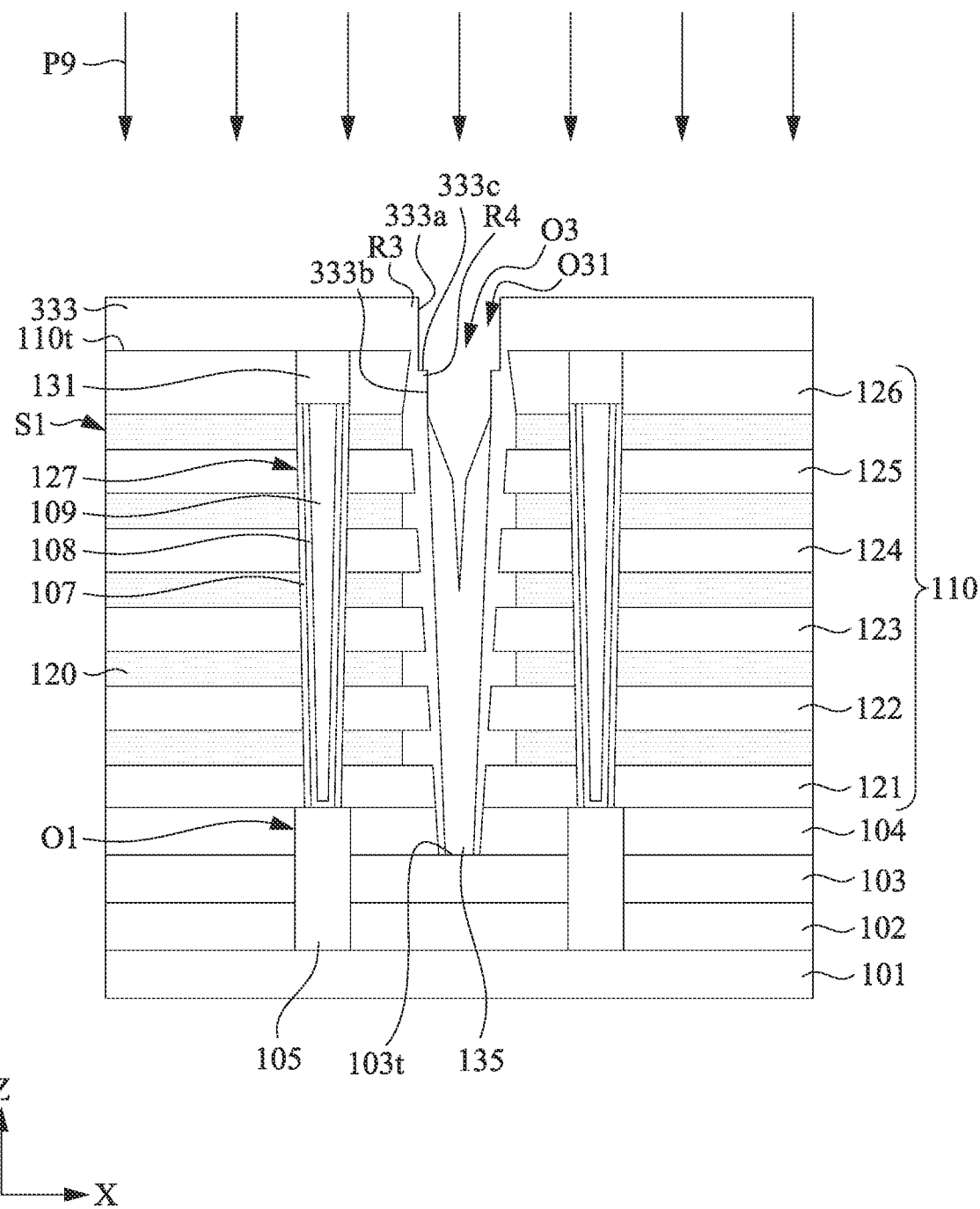
FIGS. 14C and 15C are cross-sectional views illustrating a method for manufacturing an IC structure in different stages in accordance with some embodiments.
Figure 15C:
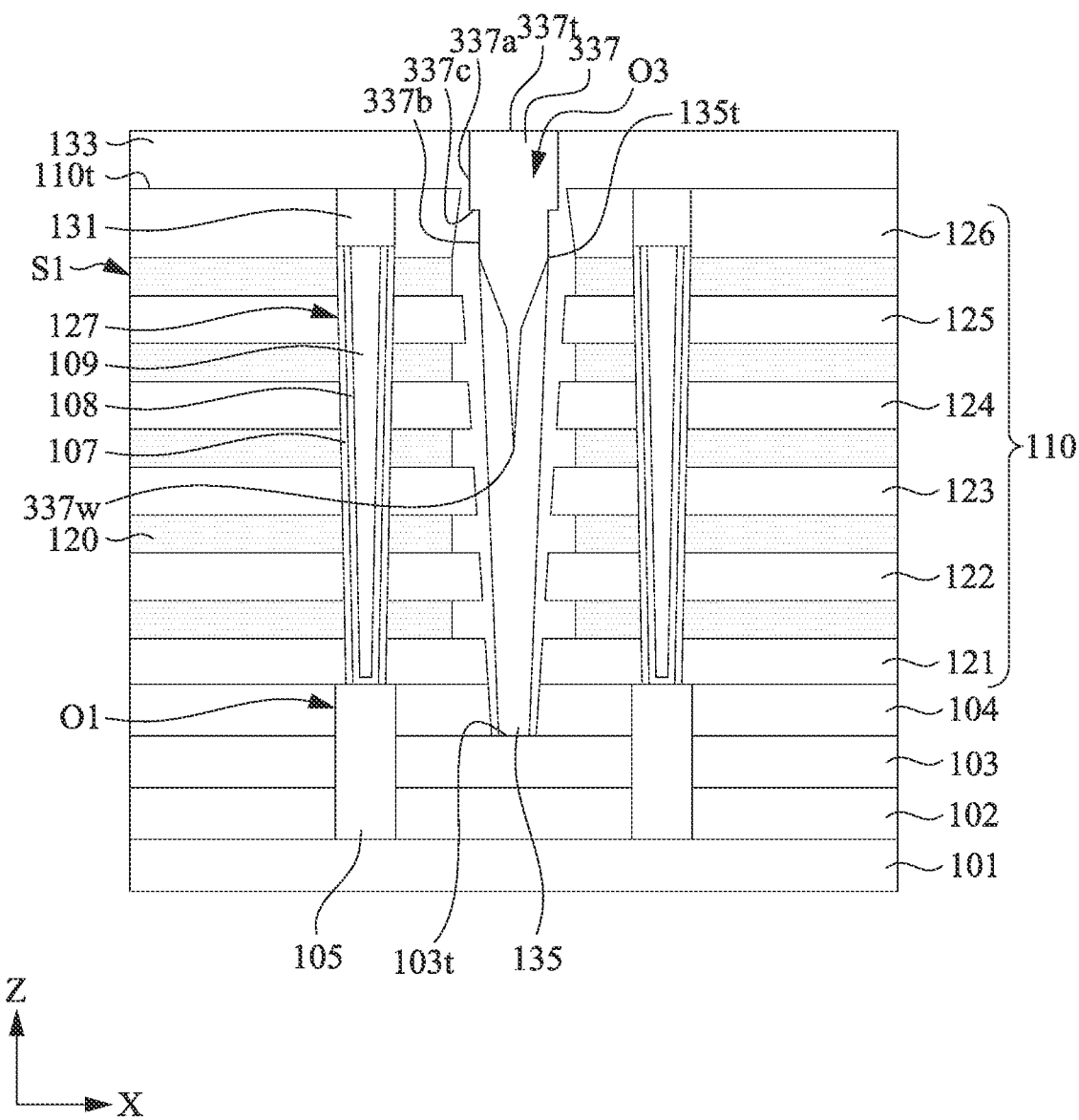

FIGS. 14C and 15C are cross-sectional views illustrating a method for manufacturing an IC structure 300 in different stages in accordance with some embodiments. Operations for forming the IC structure 300 are substantially the same as the operations for forming the IC structure 100 described in foregoing descriptions and thus are not repeated herein for the sake of clarity. FIGS. 14C and 15C illustrates a different profile of the metal plug 337 than FIGS. 1-13, 14A, 15A, and 16.

FIG. 14C illustrates the IC structure 300 at a stage corresponding to FIG. 14A according to some alternative embodiments of the present disclosure. As shown in FIG. 14C, a dry etching process P9 can be a plasma etching process that uses a high-polymeric gas and is performed under a low pressure to increase downward plasma strikes upon the dielectric material 333. The etching gas may include a high-polymeric gas, such as $C_4F_6$, $C_4F_8$, $C_5F_8$, $C_3F_8$, or combinations thereof. The dry etching process P9 can inhibit overhangs formed on the resulting dielectric material 333 compared with the case where without performing dry etching process P9, which in turn improves a gap fill window of one or more following deposition process (e.g., process for forming the metal plug 337 as shown in FIG. 15C). The sputter etch in the dry etching process P9 may result in tip corners R3 and R4 formed on the dielectric material 233, the tip corners R3 and R4 including an upper slant facet 333a, a lower slant facet 333b, and an intermediary surface 333c. The upper slant facet 333a laterally set back from a top of the lower slant facet 333b, and an intermediary surface 337c connecting the top of the lower slant facet 333b to a bottom of the upper slant facet 333a. The slant facets 333a and 333b are formed such that a remainder of the upper portion O31 of the through opening O3 in the dielectric material 333 widens as it extends away from the bonding pad 135, thus improving the gap fill window of one or more following deposition process. In some embodiments, the remainder of the upper portion O31 of the through opening O3 in the dielectric material 333 as shown in FIG. 14C can be interchangeably referred to a stair-shaped profile.

FIG. 15C illustrates the IC structure 300 at a stage corresponding to FIG. 15A according to some alternative embodiments of the present disclosure. As shown in FIG. 15C, the metal plug 337 includes an upper sidewall 337a, a lower sidewall 337b laterally set back from a bottom of the upper sidewall 337a, and an intermediary surface 337c connecting the bottom of the upper sidewall 337a to a top of the lower sidewall 337b. The metal plug 337 may have a width increasing from a bottom end 337w thereof to a top end 337t thereof. Specifically, a width of the top end 337t of the metal plug 337 may be greater than at least 1.5 times a width the metal plug 337 at a position level with a top end 135t of the bonding pad 135. In some embodiments, the top end 337t of the metal plug 337 may have a lateral dimension greater than a maximum dimension of the through opening O3. In some embodiments, the metal plug 337 is seam-free.

For next generation semiconductor devices, it is desirable to include memories that can provide high density storage. Therefore, a 3-dimensional (3D) integrated circuit (IC) memory device, such as 3D NAND, can provide high density storage by its multi-layered structure. However, the more layers in 3D NAND are stacked, the harder it is for forming a source line in the 3D NAND, which may result in a seam formed in the source line. After a planarization process preformed on the source line, an etching gas (e.g., Fluorine) would be trapped/stuck in the seam and impact the following manufacturing process (e.g., fluorine leakage).

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a top widen etching process that can prevent a seam formed in the source line. Specifically, a top widen etching process is performed by introducing a high-polymeric etching gas on the dielectric material under a low pressure to modify the source line trench where the source line will be formed therein. The top widen etching process can increase vertically downward plasma strikes upon the dielectric material to enlarge the upper portion of the source line trench while only minimally removing the lower portion of the dielectric material in the source line trench. Therefore, a difference between the upper portion and the lower portion of the source line trench can be increased to improve a gap fill window of the following deposition process for forming the source line and prevent a seam formed in the source line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
   a substrate;
   a conductive layer over the substrate;
   a plurality of memory devices stacked in a vertical direction over the conductive layer;
   a first bonding pad over the conductive layer; and a source line extending upwardly from the first bonding pad and having a lower portion inlaid in the first bonding pad and an upper portion having a sidewall coterminous with a sidewall of the first bonding pad, wherein a top end of the source line has a first lateral dimension greater than a second lateral dimension of the first bonding pad;

a dielectric material disposed over the memory devices and along a sidewall of the source line, wherein the dielectric material comprises a rounded corner having a curved facet and a slant facet positioned below the curved facet and having a steeper slope than the curved facet.

2. The IC structure of claim 1, wherein the first lateral dimension of the top end of the source line is greater than about 1.5 times a third lateral dimension of the source line measured in a position level with a top end of the first bonding pad.

3. The IC structure of claim 1, the dielectric material laterally surrounds the source line and the first bonding pad, wherein the first lateral dimension of the top end of the source line is greater than a fourth lateral dimension of the dielectric material on the first bonding pad.

4. The IC structure of claim 1, wherein the memory devices each comprise a gate layer laterally extending above the conductive layer, and the upper portion of the source line overlaps the gate layers of the memory devices.

5. The IC structure of claim 4, further comprising a plurality of insulating layers alternately stacked in the vertical direction with the gate layers, wherein the upper portion of the source line overlaps the insulating layers.

6. The IC structure of claim 1, wherein the source line has a width increasing from a bottom end thereof to the top end thereof.

7. The IC structure of claim 1, wherein the sidewall of the upper portion of the source line is curved from a bottom end thereof to the top end thereof.

8. The IC structure of claim 1, wherein the sidewall of the upper portion of the source line is a stepped sidewall structure comprising an upper sidewall, a lower sidewall laterally set back from a bottom of the upper sidewall, and an intermediary surface connecting the bottom of the upper sidewall to a top of the lower sidewall.

9. The IC structure of claim 1, wherein the source line is seam-free.

10. The IC structure of claim 1, wherein the memory devices are NAND memory devices.

11. The IC structure of claim 1, wherein when viewed in a cross-section, the upper portion of the source line comprises an outwardly curved sidewall segment extending from above a junction with the lower portion of the source line to a top surface of the upper portion of the source line, and the lower portion of the source line comprises a first sidewall segment adjacent to the substrate, having a first inclination angle with respect to the vertical direction, and a second sidewall segment above the first sidewall segment, having a second inclination angle greater than the first inclination angle.

12. The IC structure of claim 11, wherein when viewed in the cross-section, the upper portion of the source line further comprises a vertical sidewall segment extending from the junction with the lower portion of the source line to the outwardly curved sidewall segment of the upper portion of the source line.

13. The IC structure of claim 1, further comprising:
a second bonding pad disposed over and electrically coupled to the memory devices, wherein the upper portion of the source line extends vertically higher than a top surface of the second bonding pad.

* * * * *